(12) United States Patent
Tsuboi

(10) Patent No.: US 10,735,028 B2
(45) Date of Patent: Aug. 4, 2020

(54) DATA PROCESSING DEVICE AND DATA PROCESSING METHOD

(71) Applicant: RENESAS ELECTRONICS CORPORATION, Tokyo (JP)

(72) Inventor: Yukitoshi Tsuboi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/175,567

(22) Filed: Oct. 30, 2018

(65) Prior Publication Data

US 2019/0190540 A1   Jun. 20, 2019

(30) Foreign Application Priority Data

Dec. 20, 2017   (JP) .................................. 2017-243558

(51) Int. Cl.
| | |
|---|---|
| H03M 13/00 | (2006.01) |
| H03M 13/29 | (2006.01) |
| H03M 13/37 | (2006.01) |
| H03M 13/19 | (2006.01) |
| G06F 11/10 | (2006.01) |

(52) U.S. Cl.
CPC ..... *H03M 13/2906* (2013.01); *G06F 11/1012* (2013.01); *H03M 13/19* (2013.01); *H03M 13/3738* (2013.01); *H03M 13/616* (2013.01); *H03M 13/6575* (2013.01); *H03M 13/2957* (2013.01)

(58) Field of Classification Search
CPC ........... H03M 13/2906; H03M 13/616; H03M 13/3738; H03M 13/19; H03M 13/6575; H03M 13/2957; G06F 11/1012
See application file for complete search history.

(56) References Cited

U.S. PATENT DOCUMENTS

2018/0053545 A1* 2/2018 Son ...................... G11C 29/42

FOREIGN PATENT DOCUMENTS

JP   2005-004288 A   1/2005

OTHER PUBLICATIONS

M. Y. Hsiao, "A Class of Optimal Minimum Odd-weight-columnSEC-DED Codes", IBM Journal of Research and Development, vol. 14, Issue 4, published by IBM, Jul. 1970.

* cited by examiner

*Primary Examiner* — Samir W Rizk
(74) *Attorney, Agent, or Firm* — McDermott Will & Emery LLP

(57) ABSTRACT

The subject is to improve the detection performance in the error detection of data using an ECC. A data processing device 1 includes an encoder device 2 that includes an encoder unit to generate an ECC by performing operations according to a first ECC generation matrix and an encoder unit 5 to generate an ECC by performing operations according to a second ECC generation matrix obtained by permutating a column of the first ECC generation matrix. The encoder unit 4 generates the first ECC for the first data. The encoder unit 5 generates the second ECC for the second data obtained by permutating a bit of the first data.

12 Claims, 31 Drawing Sheets

E0 = D0 + D1 + D2 + D3 + D4
E1 = D0 + D1 + D2 + D5 + D6
E2 = D0 + D3 + D5 + D6 + D7
E3 = D1 + D3 + D4 + D5 + D7
E4 = D2 + D4 + D6 + D7
("+": XOR OPERATION)

READ DATA D0-D7 → /8 → ECC DECODER CIRCUIT → /8 → OUTPUT DATA D'0-D'7

ECC (READ) E0-E4 → /5 →

1bit → SINGLE-BIT ERROR NOTIFICATION SIGNAL (CORRECTED)

2bit → DOUBLE-BIT ERROR NOTIFICATION SIGNAL (UNCORRECTABLE)

[ERROR NOTIFICATION SIGNAL]

31

|    | D0 | D1 | D2 | D3 | D4 | D5 | D6 | D7 | E0 | E1 | E2 | E3 | E4 |
|----|----|----|----|----|----|----|----|----|----|----|----|----|----|
| S0 | 1  | 1  | 1  | 1  | 1  | 0  | 0  | 0  | 1  | 0  | 0  | 0  | 0  |
| S1 | 1  | 1  | 1  | 0  | 0  | 1  | 1  | 0  | 0  | 1  | 0  | 0  | 0  |
| S2 | 1  | 0  | 0  | 1  | 0  | 1  | 1  | 1  | 0  | 0  | 1  | 0  | 0  |
| S3 | 0  | 1  | 0  | 1  | 1  | 1  | 0  | 1  | 0  | 0  | 0  | 1  | 0  |
| S4 | 0  | 0  | 1  | 0  | 1  | 0  | 1  | 1  | 0  | 0  | 0  | 0  | 1  |

$S0 = D0 + D1 + D2 + D3 + D4 + E0$ $S1 = D0 + D1 + D2 + D5 + D6 + E1$ $S2 = D0 + D3 + D5 + D6 + D7 + E2$ $S3 = D1 + D3 + D4 + D5 + D7 + E3$ $S4 = D2 + D4 + D6 + D7\ \ \ \ + E4$ ("+": XOR OPERATION)

FIG. 10

| | k = 0 | k = 1 | k = 2 | k = 3 | k = 4 | k = 5 | k = 6 | k = 7 | k = 8 | k = 9 | k = 10 | k = 11 | k = 12 | k = 13 | SUM TOTAL |
|---|---|---|---|---|---|---|---|---|---|---|---|---|---|---|---|
| COMBINATION TOTAL NUMBER $C(n, k) = {}_nC_k$ (n = 8 + 5 = 13) | 1 | 13 | 78 | 286 | 715 | 1,287 | 1,716 | 1,716 | 1,287 | 715 | 286 | 78 | 13 | 1 | 8,192 |
| DETECTION MISS NUMBER W(k) (RESULT OF COUNTING) | 0 | 0 | 0 | 0 | 55 | 0 | 96 | 0 | 87 | 0 | 16 | 0 | 1 | 0 | 255 |
| DETECTION MISS PROBABILITY $P_k = W(k)/C(n, k)$ (n = 13) | 0% | 0% | 0% | 0% | 7.7% | 0% | 5.6% | 0% | 6.8% | 0% | 5.6% | 0% | 7.7% | 0% | AVERAGE 3.1% |

FIG. 11

| | k=0 | k=1 | k=2 | k=3 | k=4 | k=5 | k=6 | k=7 | k=8 | k=9 | k=10 | k=11 | k=12 | k=13 | SUM TOTAL |
|---|---|---|---|---|---|---|---|---|---|---|---|---|---|---|---|
| COMBINATION TOTAL NUMBER $C(n, k) = {}_nC_k$ $(n = 8 + 5 = 13)$ | 1 | 13 | 78 | 286 | 715 | 1,287 | 1,716 | 1,716 | 1,287 | 715 | 286 | 78 | 13 | 1 | 8,192 |
| ERRONEOUS CORRECTION NUMBER $X(k) = W(k+1)*(k+1) + W(k-1)*(n-(k-1))$ | 0 | 0 | 0 | 220 | 0 | 1,071 =576 +495 | 0 | 1,368 =696 +672 | 0 | 595 =160 +435 | 0 | 60 =12 +48 | 0 | 1 | 3,315 |
| ERRONEOUS CORRECTION PROBABILITY $Q_k = X(k)/C(n, k)$ $(n = 13)$ | 0% | 0% | 0% | 76.9% | 0% | 83.2% | 0% | 79.7% | 0% | 83.2% | 0% | 76.9% | 0% | 100% | AVERAGE 40.5% |

|    | D0 | D1 | D2 | D3 | D4 | D5 | D6 | D7 |
|----|----|----|----|----|----|----|----|----|
| F0 | 1  | 1  | 1  | 1  | 0  | 0  | 0  | 1  |
| F1 | 1  | 1  | 0  | 0  | 1  | 1  | 0  | 1  |
| F2 | 0  | 0  | 1  | 0  | 1  | 1  | 1  | 1  |
| F3 | 1  | 0  | 1  | 1  | 1  | 0  | 1  | 0  |
| F4 | 0  | 1  | 0  | 1  | 0  | 1  | 1  | 0  |

FIG. 17

| | D0 | D1 | D2 | D3 | D4 | D5 | D6 | D7 | E0 | E1 | E2 | E3 | E4 | F0 | F1 | F2 | F3 | F4 |
|---|---|---|---|---|---|---|---|---|---|---|---|---|---|---|---|---|---|---|
| S0 | 1 | 1 | 1 | 1 | 1 | 0 | 0 | 0 | 1 | 0 | 0 | 0 | 0 | 0 | 0 | 0 | 0 | 0 |
| S1 | 1 | 1 | 1 | 0 | 0 | 1 | 1 | 0 | 0 | 1 | 0 | 0 | 0 | 0 | 0 | 0 | 0 | 0 |
| S2 | 1 | 0 | 0 | 1 | 0 | 1 | 1 | 1 | 0 | 0 | 1 | 0 | 0 | 0 | 0 | 0 | 0 | 0 |
| S3 | 0 | 1 | 0 | 1 | 1 | 1 | 0 | 1 | 0 | 0 | 0 | 1 | 0 | 0 | 0 | 0 | 0 | 0 |
| S4 | 0 | 0 | 1 | 0 | 1 | 0 | 1 | 1 | 0 | 0 | 0 | 0 | 1 | 0 | 0 | 0 | 0 | 0 |

FIG. 18

| | D0 | D1 | D2 | D3 | D4 | D5 | D6 | D7 | E0 | E1 | E2 | E3 | E4 | F0 | F1 | F2 | F3 | F4 |
|---|---|---|---|---|---|---|---|---|---|---|---|---|---|---|---|---|---|---|
| R0 | 1 | 1 | 1 | 1 | 0 | 0 | 0 | 1 | 0 | 0 | 0 | 0 | 0 | 1 | 0 | 0 | 0 | 0 |
| R1 | 1 | 1 | 0 | 0 | 1 | 1 | 0 | 1 | 0 | 0 | 0 | 0 | 0 | 0 | 1 | 0 | 0 | 0 |
| R2 | 0 | 0 | 1 | 0 | 1 | 1 | 1 | 1 | 0 | 0 | 0 | 0 | 0 | 0 | 0 | 1 | 0 | 0 |
| R3 | 1 | 0 | 1 | 1 | 0 | 0 | 1 | 0 | 0 | 0 | 0 | 0 | 0 | 0 | 0 | 0 | 1 | 0 |
| R4 | 0 | 1 | 0 | 1 | 1 | 1 | 1 | 0 | 0 | 0 | 0 | 0 | 0 | 0 | 0 | 0 | 0 | 1 |

FIG. 20A

| | D0 | D1 | D2 | D3 | D4 | D5 | D6 | D7 | D8 | D9 | D10 | D11 | D12 | D13 | D14 | D15 |
|---|---|---|---|---|---|---|---|---|---|---|---|---|---|---|---|---|
| E0 | 1 | 1 | 1 | 1 | 1 | 1 | 1 | 1 | 0 | 0 | 1 | 0 | 0 | 1 | 1 | 0 |
| E1 | 1 | 1 | 1 | 0 | 0 | 0 | 0 | 0 | 1 | 1 | 1 | 1 | 1 | 1 | 1 | 1 |
| E2 | 0 | 0 | 0 | 1 | 0 | 1 | 0 | 0 | 1 | 1 | 1 | 0 | 1 | 0 | 0 | 0 |
| E3 | 0 | 0 | 0 | 1 | 0 | 0 | 1 | 1 | 0 | 0 | 0 | 1 | 0 | 1 | 0 | 0 |
| E4 | 0 | 0 | 0 | 1 | 0 | 0 | 0 | 0 | 0 | 0 | 0 | 1 | 0 | 0 | 0 | 1 |
| E5 | 1 | 0 | 0 | 1 | 1 | 0 | 0 | 1 | 1 | 0 | 0 | 1 | 0 | 0 | 0 | 0 |
| E6 | 0 | 1 | 0 | 0 | 0 | 0 | 0 | 1 | 0 | 0 | 0 | 1 | 1 | 0 | 0 | 0 |
| E7 | 0 | 0 | 1 | 0 | 0 | 1 | 1 | 0 | 0 | 1 | 0 | 0 | 1 | 0 | 0 | 1 |

| | D16 | D17 | D18 | D19 | D20 | D21 | D22 | D23 | D24 | D25 | D26 | D27 | D28 | D29 | D30 | D31 |
|---|---|---|---|---|---|---|---|---|---|---|---|---|---|---|---|---|
| E0 | 0 | 1 | 0 | 0 | 1 | 0 | 0 | 1 | 1 | 0 | 0 | 1 | 0 | 0 | 0 | 0 |
| E1 | 0 | 0 | 1 | 0 | 1 | 1 | 1 | 0 | 0 | 0 | 0 | 0 | 1 | 0 | 0 | 1 |
| E2 | 1 | 1 | 1 | 1 | 1 | 1 | 1 | 1 | 0 | 1 | 1 | 0 | 0 | 1 | 1 | 0 |
| E3 | 1 | 1 | 1 | 0 | 0 | 0 | 0 | 0 | 1 | 1 | 1 | 1 | 1 | 1 | 1 | 1 |
| E4 | 0 | 0 | 0 | 1 | 0 | 1 | 0 | 0 | 1 | 1 | 1 | 0 | 1 | 0 | 0 | 0 |
| E5 | 0 | 0 | 0 | 1 | 0 | 0 | 1 | 1 | 0 | 0 | 0 | 1 | 0 | 1 | 0 | 0 |
| E6 | 0 | 0 | 0 | 1 | 0 | 0 | 0 | 0 | 0 | 0 | 0 | 1 | 0 | 0 | 0 | 1 |
| E7 | 1 | 0 | 0 | 1 | 1 | 0 | 0 | 1 | 1 | 0 | 0 | 1 | 0 | 0 | 0 | 0 |

FIG. 20B

| | D32 | D33 | D34 | D35 | D36 | D37 | D38 | D39 | D40 | D41 | D42 | D43 | D44 | D45 | D46 | D47 |
|---|---|---|---|---|---|---|---|---|---|---|---|---|---|---|---|---|
| E0 | 0 | 0 | 0 | 1 | 0 | 0 | 0 | 0 | 0 | 0 | 1 | 0 | 0 | 0 | 1 | 1 |
| E1 | 1 | 0 | 0 | 1 | 0 | 0 | 0 | 0 | 0 | 0 | 1 | 0 | 0 | 0 | 0 | 0 |
| E2 | 0 | 1 | 0 | 0 | 1 | 0 | 1 | 1 | 1 | 0 | 1 | 0 | 0 | 0 | 0 | 0 |
| E3 | 0 | 0 | 1 | 0 | 1 | 1 | 1 | 0 | 0 | 1 | 0 | 1 | 1 | 0 | 0 | 1 |
| E4 | 1 | 1 | 1 | 1 | 0 | 1 | 0 | 1 | 0 | 0 | 0 | 0 | 0 | 1 | 1 | 0 |
| E5 | 1 | 1 | 1 | 0 | 1 | 0 | 0 | 0 | 1 | 1 | 1 | 1 | 1 | 1 | 1 | 1 |
| E6 | 0 | 0 | 0 | 1 | 0 | 1 | 1 | 0 | 1 | 1 | 1 | 1 | 0 | 0 | 0 | 0 |
| E7 | 0 | 0 | 0 | 1 | 0 | 0 | 1 | 1 | 0 | 0 | 0 | 1 | 1 | 1 | 0 | 0 |

| | D48 | D49 | D50 | D51 | D52 | D53 | D54 | D55 | D56 | D57 | D58 | D59 | D60 | D61 | D62 | D63 |
|---|---|---|---|---|---|---|---|---|---|---|---|---|---|---|---|---|
| E0 | 0 | 0 | 0 | 1 | 0 | 1 | 0 | 0 | 0 | 1 | 1 | 0 | 0 | 0 | 0 | 0 |
| E1 | 0 | 0 | 0 | 1 | 0 | 0 | 1 | 1 | 0 | 0 | 0 | 1 | 1 | 1 | 0 | 0 |
| E2 | 0 | 0 | 0 | 1 | 0 | 0 | 1 | 0 | 0 | 0 | 0 | 1 | 0 | 0 | 1 | 1 |
| E3 | 1 | 0 | 0 | 0 | 0 | 0 | 0 | 1 | 1 | 0 | 0 | 1 | 0 | 0 | 0 | 0 |
| E4 | 0 | 1 | 1 | 0 | 1 | 1 | 1 | 0 | 0 | 1 | 0 | 0 | 0 | 0 | 0 | 0 |
| E5 | 0 | 0 | 0 | 1 | 0 | 0 | 1 | 1 | 0 | 0 | 1 | 0 | 1 | 0 | 1 | 1 |
| E6 | 1 | 1 | 1 | 0 | 1 | 1 | 0 | 0 | 1 | 0 | 0 | 0 | 1 | 0 | 1 | 0 |
| E7 | 1 | 1 | 1 | 0 | 0 | 0 | 0 | 0 | 1 | 1 | 1 | 0 | 1 | 1 | 1 | 1 |

FIG. 22

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER C(n, k) = nCk (n = 8 + 5 + 5 = 18) | 1 | 18 | 153 | 816 | 3,060 | 8,568 | 18,564 | 31,824 | 43,758 | 48,620 | 43,758 |
| DETECTION MISS NUMBER W(k) (RESULT OF COUNTING) | 0 | 0 | 0 | 0 | 0 | 11 | 17 | 32 | 50 | 38 | 38 |
| DETECTION MISS PROBABILITY Pk = W(k)/C(n, k) (n = 18) | 0% | 0% | 0% | 0% | 0% | 0.13% | 0.09% | 0.10% | 0.11% | 0.08% | 0.09% |

| | k = 11 | k = 12 | k = 13 | k = 14 | k = 15 | k = 16 | k = 17 | k = 18 | SUM TOTAL | | |
|---|---|---|---|---|---|---|---|---|---|---|---|
| COMBINATION TOTAL NUMBER C(n, k) = nCk (n = 8 + 5 + 5 = 18) | 31,824 | 18,564 | 8,568 | 3,060 | 816 | 153 | 18 | 1 | 262,144 | | |
| DETECTION MISS NUMBER W(k) (RESULT OF COUNTING) | 40 | 20 | 7 | 1 | 0 | 1 | 0 | 0 | 255 | | |
| DETECTION MISS PROBABILITY Pk = W(k)/C(n, k) (n = 18) | 0.13% | 0.11% | 0.08% | 0.03% | 0% | 0.65% | 0% | 0% | AVERAGE 0.10% | | |

FIG. 23

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER $C(n, k) = {}_nC_k$ (n = 8 + 5 + 5 = 18) | 1 | 18 | 153 | 816 | 3,060 | 8,568 | 18,564 | 31,824 | 43,758 | 48,620 | 43,758 |
| ERRONEOUS CORRECTION NUMBER $X(k) = W(k+1)*(k+1) + W(k-1)*(n-(k-1))$ | 0 | 0 | 0 | 0 | 55 | 102 | 367 = 224 + 143 | 604 = 400 + 204 | 694 = 342 + 352 | 880 = 380 + 500 | 782 = 440 + 342 |
| ERRONEOUS CORRECTION PROBABILITY $Q_k = X(k)/C(n, k)$ (n = 18) | 0% | 0% | 0% | 0% | 1.80% | 1.19% | 1.98% | 1.90% | 1.59% | 1.81% | 1.79% |

| | k = 11 | k = 12 | k = 13 | k = 14 | k = 15 | k = 16 | k = 17 | k = 18 | | SUM TOTAL | |
|---|---|---|---|---|---|---|---|---|---|---|---|
| COMBINATION TOTAL NUMBER $C(n, k) = {}_nC_k$ (n = 8 + 5 + 5 = 18) | 31,824 | 18,564 | 8,568 | 3,060 | 816 | 153 | 18 | 1 | | 262,144 | |
| ERRONEOUS CORRECTION NUMBER $X(k) = W(k+1)*(k+1) + W(k-1)*(n-(k-1))$ | 544 = 240 + 304 | 371 = 91 + 280 | 134 = 14 + 120 | 35 | 20 = 16 + 4 | 0 | 2 | 0 | | 4,590 | AVERAGE |
| ERRONEOUS CORRECTION PROBABILITY $Q_k = X(k)/C(n, k)$ (n = 18) | 1.71% | 2.00% | 1.56% | 1.14% | 2.45% | 0% | 11.1% | 0% | | | 1.75% |

FIG. 27

|    | D0 | D1 | D2 | D3 | D4 | D5 | D6 | D7 | E0 | E1 | E2 | E3 | E4 | F2 | F3 | F4 |
|----|----|----|----|----|----|----|----|----|----|----|----|----|----|----|----|----|
| S0 | 1  | 1  | 1  | 1  | 1  | 0  | 0  | 0  | 1  | 0  | 0  | 0  | 0  | 0  | 0  | 0  |
| S1 | 1  | 1  | 1  | 0  | 0  | 1  | 1  | 0  | 0  | 1  | 0  | 0  | 0  | 0  | 0  | 0  |
| S2 | 1  | 0  | 0  | 1  | 0  | 1  | 1  | 1  | 0  | 0  | 1  | 0  | 0  | 0  | 0  | 0  |
| S3 | 0  | 1  | 0  | 1  | 1  | 0  | 0  | 1  | 0  | 0  | 0  | 1  | 0  | 0  | 0  | 0  |
| S4 | 0  | 0  | 1  | 0  | 1  | 1  | 1  | 1  | 0  | 0  | 0  | 0  | 1  | 0  | 0  | 0  |

|    | D0 | D1 | D2 | D3 | D4 | D5 | D6 | D7 | F0 | F1 | E2 | E3 | E4 | F2 | F3 | F4 |
|----|----|----|----|----|----|----|----|----|----|----|----|----|----|----|----|----|
| R0 | 1  | 1  | 1  | 1  | 1  | 0  | 0  | 0  | 1  | 0  | 0  | 0  | 0  | 0  | 0  | 0  |
| R1 | 1  | 1  | 1  | 0  | 0  | 1  | 1  | 0  | 0  | 1  | 0  | 0  | 0  | 0  | 0  | 0  |
| R2 | 0  | 0  | 1  | 1  | 0  | 1  | 1  | 1  | 0  | 0  | 0  | 0  | 0  | 1  | 0  | 0  |
| R3 | 1  | 0  | 0  | 1  | 1  | 0  | 0  | 1  | 0  | 0  | 0  | 0  | 0  | 0  | 1  | 0  |
| R4 | 0  | 0  | 0  | 1  | 1  | 0  | 1  | 1  | 0  | 0  | 0  | 0  | 0  | 0  | 0  | 1  |

FIG. 30

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER C(n, k) = nCk (n = 8 + 5 + 3 = 16) | 1 | 16 | 120 | 560 | 1,820 | 4,368 | 8,008 | 11,440 | 12,870 | 11,440 | 8,008 |
| DETECTION MISS NUMBER W(k) (RESULT OF COUNTING) | 0 | 0 | 0 | 0 | 3 | 22 | 37 | 44 | 47 | 40 | 34 |
| DETECTION MISS PROBABILITY Pk = W(k)/C(n, k) (n = 16) | 0% | 0% | 0% | 0% | 0.16% | 0.50% | 0.46% | 0.38% | 0.37% | 0.35% | 0.42% |

| | k = 11 | k = 12 | k = 13 | k = 14 | k = 15 | k = 16 | SUM TOTAL | | AVERAGE |
|---|---|---|---|---|---|---|---|---|---|
| COMBINATION TOTAL NUMBER C(n, k) = nCk (n = 8 + 5 + 3 = 16) | 4,368 | 1,820 | 560 | 120 | 16 | 1 | 65,536 | | |
| DETECTION MISS NUMBER W(k) (RESULT OF COUNTING) | 20 | 5 | 2 | 1 | 0 | 0 | 255 | | |
| DETECTION MISS PROBABILITY Pk = W(k)/C(n, k) (n = 16) | 0.46% | 0.27% | 0.36% | 0.83% | 0% | 0% | | | 0.39% |

FIG. 31

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER C(n, k) = nCk (n = 8 + 5 + 3 = 16) | 1 | 16 | 120 | 560 | 1,820 | 4,368 | 8,008 | 11,440 | 12,870 | 11,440 | 8,008 |
| ERRONEOUS CORRECTION NUMBER X(k) = W(k+1)*(k+1) + W(k-1)*(n-(k-1)) | 0 | 0 | 0 | 12 | 110 | 258 =222 +36 | 550 =308 +242 | 746 =376 +370 | 756 =360 +396 | 716 =340 +376 | 500 =220 +280 |
| ERRONEOUS CORRECTION PROBABILITY Qk = X(k)/C(n, k) (n = 16) | 0% | 0% | 0% | 2.14% | 6.04% | 5.91% | 6.87% | 6.52% | 5.87% | 6.26% | 6.24% |

| | k = 11 | k = 12 | k = 13 | k = 14 | k = 15 | k = 16 | SUM TOTAL | |
|---|---|---|---|---|---|---|---|---|
| COMBINATION TOTAL NUMBER C(n, k) = nCk (n = 8 + 5 + 3 = 16) | 4,368 | 1,820 | 560 | 120 | 16 | 1 | 65,536 | |
| ERRONEOUS CORRECTION NUMBER X(k) = W(k+1)*(k+1) + W(k-1)*(n-(k-1)) | 264 =60 +204 | 126 =26 +100 | 34 =14 +20 | 6 | 2 | 0 | 4,080 | |
| ERRONEOUS CORRECTION PROBABILITY Qk = X(k)/C(n, k) (n = 16) | 6.04% | 6.92% | 6.07% | 5.00% | 12.5% | 0% | AVERAGE | 6.23% |

FIG. 36

| | D0 | D1 | D2 | D3 | D4 | D5 | D6 | D7 | E0 | E1 | E2 | E3 | E4 | G5 | G6 | G7 | | | |
|---|---|---|---|---|---|---|---|---|---|---|---|---|---|---|---|---|---|---|---|
| S0 | 1 | 1 | 1 | 1 | 1 | 0 | 0 | 0 | 1 | 0 | 0 | 0 | 0 | — | — | — | 0 | 0 | 0 |
| S1 | 1 | 1 | 1 | 0 | 0 | 1 | 1 | 0 | 0 | 1 | 0 | 0 | 0 | — | — | — | 1 | 0 | 0 |
| S2 | 1 | 0 | 0 | 1 | 0 | 1 | 1 | 1 | 0 | 0 | 1 | 0 | 0 | — | — | — | 0 | 1 | 0 |
| S3 | 0 | 1 | 0 | 0 | 1 | 1 | 0 | 1 | 0 | 0 | 0 | 1 | 0 | — | — | — | 0 | 0 | 1 |
| S4 | 0 | 0 | 1 | 1 | 1 | 0 | 1 | 1 | 0 | 0 | 0 | 0 | 1 | — | — | — | 0 | 0 | 0 |
| Q5 | 0 | 1 | 1 | 1 | 1 | 1 | 0 | 0 | — | — | — | — | — | 1 | 0 | 0 | 0 | 0 | 0 |
| Q6 | 0 | 0 | 0 | 1 | 1 | 0 | 1 | 0 | — | — | — | — | — | 0 | 1 | 0 | 0 | 1 | 0 |
| Q7 | 0 | 1 | 1 | 1 | 0 | 1 | 1 | 0 | — | — | — | — | — | 0 | 0 | 1 | 0 | 0 | 1 |

ECC CHECK SUBMATRIX · CHECK-BIT CHECK MATRIX — ECC CHECK FULL-MATRIX

FIG. 38

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER C(n, k) = nCk (n = 8 + 8 = 16) | 1 | 16 | 120 | 560 | 1,820 | 4,368 | 8,008 | 11,440 | 12,870 | 11,440 | 8,008 |
| DETECTION MISS NUMBER W(k) (RESULT OF COUNTING) | 0 | 0 | 0 | 0 | 9 | 0 | 76 | 0 | 87 | 0 | 68 |
| DETECTION MISS PROBABILITY Pk = W(k)/C(n, k) (n = 16) | 0% | 0% | 0% | 0% | 0.49% | 0% | 0.95% | 0% | 0.68% | 0% | 0.85% |

| | k = 11 | k = 12 | k = 13 | k = 14 | k = 15 | k = 16 | | SUM TOTAL | |
|---|---|---|---|---|---|---|---|---|---|
| COMBINATION TOTAL NUMBER C(n, k) = nCk (n = 8 + 8 = 16) | 4,368 | 1,820 | 560 | 120 | 16 | 1 | | 65,536 | |
| DETECTION MISS NUMBER W(k) (RESULT OF COUNTING) | 0 | 15 | 0 | 0 | 0 | 0 | | 255 | |
| DETECTION MISS PROBABILITY Pk = W(k)/C(n, k) (n = 16) | 0% | 0.82% | 0% | 0% | 0% | 0% | | AVERAGE 0.39% | |

FIG. 39

| | k = 0 | k = 1 | k = 2 | k = 3 | k = 4 | k = 5 | k = 6 | k = 7 | k = 8 | k = 9 | k = 10 |
|---|---|---|---|---|---|---|---|---|---|---|---|
| COMBINATION TOTAL NUMBER C(n, k) = nCk (n = 8 + 8 = 16) | 1 | 16 | 120 | 560 | 1,820 | 4,368 | 8,008 | 11,440 | 12,870 | 11,440 | 8,008 |
| ERRONEOUS CORRECTION NUMBER X(k) = W(k+1)*(k+1) + W(k-1)*(n-(k-1)) | 0 | 0 | 0 | 36 | 0 | 564 = 456 + 108 | 0 | 1,456 = 696 + 760 | 0 | 1,376 = 680 + 696 | 0 |
| ERRONEOUS CORRECTION PROBABILITY Qk = X(k)/C(n, k) (n = 16) | 0% | 0% | 0% | 6.4% | 0% | 12.9% | 0% | 12.7% | 0% | 12.0% | 0% |

| | k = 11 | k = 12 | k = 13 | k = 14 | k = 15 | k = 16 | | SUM TOTAL | |
|---|---|---|---|---|---|---|---|---|---|
| COMBINATION TOTAL NUMBER C(n, k) = nCk (n = 8 + 8 = 16) | 4,368 | 1,820 | 560 | 120 | 16 | 1 | | 65,536 | |
| ERRONEOUS CORRECTION NUMBER X(k) = W(k+1)*(k+1) + W(k-1)*(n-(k-1)) | 588 = 180 + 408 | 0 | 60 | 0 | 0 | 0 | | 4,080 | |
| ERRONEOUS CORRECTION PROBABILITY Qk = X(k)/C(n, k) (n = 16) | 13.5% | 0% | 10.7% | 0% | 0% | 0% | AVERAGE | 6.23% | |

# DATA PROCESSING DEVICE AND DATA PROCESSING METHOD

CROSS-REFERENCE TO RELATED APPLICATIONS

The disclosure of Japanese Patent Application No. 2017-243558 filed on Dec. 20, 2017 including the specification, drawings and abstract is incorporated herein by reference in its entirety.

BACKGROUND

The present invention relates to a data processing device and a data processing method, and in particular, relates to the data processing device and data processing method for detecting data errors.

As the characteristic of an ECC (Error Correction Code) with the function of single-bit error correction and double-bit error detection (the so-called SEC-DED (single error correction and double error detection)), it is known that all the 4-or-more even-numbered bit errors cannot be detected and that there is the case in which the 3-or-more odd-numbered bit errors are erroneously recognized as a single-bit error, leading to the erroneous correction of the normal bit (Non Patent Literature 1).

On the other hand, Patent Literature 1 discloses a technology for realizing the error detection of multiple bits (3 or more bits) at a comparatively high rate, in an error detection circuit using an ECC capable of the single error correction and double error detection. This error detection circuit uses the ECC and the count number of "1" appearing in each bit of data, and enables the proper detection of errors, even when the data error cannot be detected successfully only by the check with the use of the ECC.

(Patent Literature 1) Japanese Unexamined Patent Application Publication No. 2005-4288

(Non Patent Literature 1) M. Y. Hsiao; "A Class of Optimal Minimum Odd-weight-column SEC-DED Codes", IBM Journal of Research and Development, Volume 14, Issue 4, published by IBM, July 1970.

SUMMARY

However, according to the technology disclosed by Patent Literature 1, it is necessary to provide a counter circuit that counts the number of "1" included in data, and a period of multiple clocks is necessary for the count processing. Therefore, it requires extra time for write and read to a memory, or it is necessary to raise the clock frequency. Consequently, it is desirable to develop a new method of improving detection performance, in the error detection of the data using ECC.

The other issues and new features of the present invention will become clear from the description of the present specification and the accompanying drawings.

According to one embodiment, a data processing device includes an encoder device provided with a first encoder unit that generates an ECC by performing operations according to a first ECC generation matrix and a second encoder unit that generates an ECC by performing operations according to a second ECC generation matrix obtained by permutating a column of the first ECC generation matrix. The first encoder unit generates a first ECC for first data. The second encoder unit generates a second ECC for the second data obtained by permutating a bit of the first data.

According to the one embodiment, it is possible to improve the detection performance in the error detection of data using an ECC.

BRIEF DESCRIPTION OF THE DRAWINGS

FIG. 10 is a table summarizing error detection misses occurring in the algorithm of the error detection according to the comparative example;

FIG. 11 is a table summarizing the number of the cases of erroneous correction occurring in the algorithm of the error detection according to the comparative example;

FIG. 17 is a drawing illustrating an ECC check matrix used for an ECC decoder circuit 31 of the decoder device 30;

FIG. 18 is a drawing illustrating an ECC check matrix used for an ECC decoder circuit 32 of the decoder device 30;

FIG. 20A is a drawing illustrating an example of an ECC generation matrix for generating 8-bit ECC from 64-bit input data;

FIG. 20B is a drawing illustrating an example of an ECC generation matrix for generating 8-bit ECC from 64-bit input data;

FIG. 22 is a table summarizing error detection misses occurring in the algorithm of the error detection according to Embodiment 2;

FIG. 23 is a table summarizing the number of the cases of erroneous correction occurring in the algorithm of the error detection according to Embodiment 2;

FIG. 27 is a drawing illustrating an ECC check matrix used for an ECC decoder circuit 31 of the decoder device 30B;

FIG. 28 is a drawing illustrating an ECC check matrix used for an ECC decoder circuit 34 of the decoder device 30B;

FIG. 30 is a table summarizing error detection misses occurring in the algorithm of the error detection according to a modified example of Embodiment 3;

FIG. 31 is a table summarizing the number of the cases of erroneous correction occurring in the algorithm of the error detection according to the modified example of Embodiment 3;

FIG. 36 illustrates an example of an ECC check full-matrix, an ECC check submatrix, and a check-bit check matrix;

FIG. 38 is a table summarizing error detection misses occurring in the algorithm of the error detection according to Embodiment 4; and FIG. 39 is a table summarizing the number of the cases of erroneous correction occurring in the algorithm of the error detection according to Embodiment 4.

DETAILED DESCRIPTION

Figure 1:
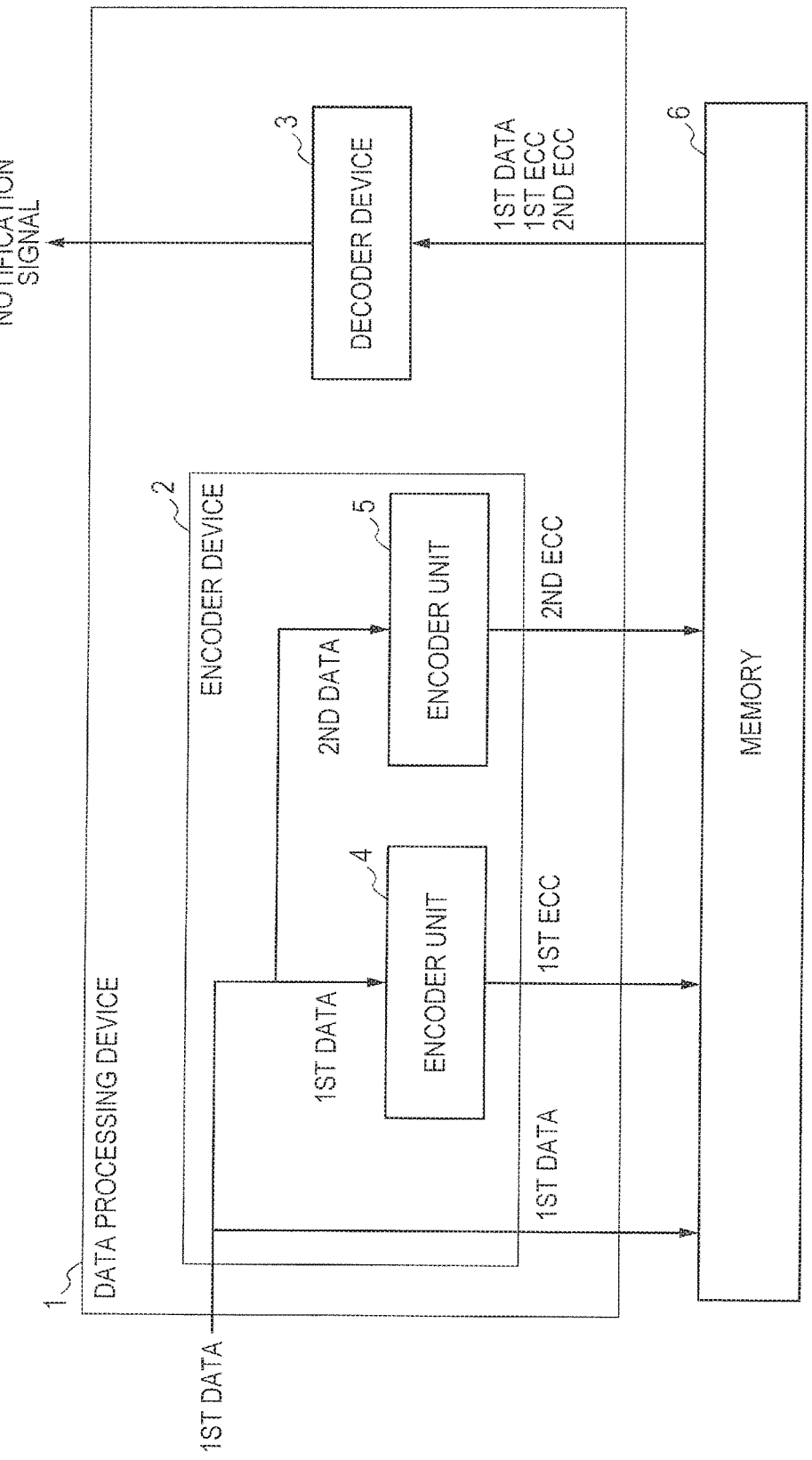
FIG. 1 is a block diagram illustrating an example of a configuration of a data processing device 1 according to an outline of Embodiment.

In the following descriptions and drawings, abbreviation and simplification are properly made for clarification of explanation. In each drawing, the same symbol or reference numeral is attached to the same element and the repeated explanation thereof is omitted properly.

The Outline of Embodiment

First, the outline of embodiment is explained prior to the detailed explanation of the embodiment. FIG. 1 is a block diagram illustrating an example of a configuration of a data processing device 1 according to the outline of Embodiment. The data processing device 1 includes an encoder device 2 and a decoder device 3.

The encoder device 2 includes an encoder unit 4 and an encoder unit 5. First data is inputted into the encoder device 2. Then, the first data is inputted into the encoder unit 4, and second data is inputted into the encoder unit 5. Here, the first data is data to be stored in a memory 6. The second data is data obtained by permutating a bit of the first data. For example, the second data may be data obtained by rotating each bit of the first data in the predetermined direction by the specified number of steps, or it may be data obtained by mutually permutating multiple predetermined bits of the first data.

The encoder unit 4 generates an ECC capable of the single error correction and double error detection (that is, an SEC-DED code), by performing operations according to the first ECC generation matrix. The encoder unit 5 generates an ECC capable of the single error correction and double error detection (that is, an SEC-DED code), by performing operations according to the second ECC generation matrix obtained by permutating a column of the first ECC generation matrix. The above-described permutation in the second data corresponds to the above-described permutation in the second ECC generation matrix. That is, the bit position of the permutation source in the permutation of the bit for deriving the second data from the first data corresponds to the column number of the permutation source in the permutation of the column for deriving the second ECC generation matrix from the first ECC generation matrix. The bit position of the permutation destination in the permutation of the bit for deriving the second data corresponds to the column number of the permutation destination in the permutation of the column for deriving the second ECC generation matrix.

The encoder unit 4 generates the first ECC for the first data. The encoder unit 5 generates the second ECC for the second data. Then, the encoder device 2 stores the first data as the storing object, the first ECC generated from the first data, and the second ECC generated from the second data, in the memory 6.

The decoder device 3 generates a notification signal indicative of the occurrence state of errors of the first data, based on the first data, the first ECC, and the second ECC, read from the memory 6.

Two different ECCs are generated in the data processing device 1 as described above. The occurrence patterns of the error that results in miss are dependent on the ECC generation matrix. When described in detail, even for the occurrence patterns of the error that results in miss in the detection processing using the first ECC, the error may be found in the detection processing using the second ECC different from the first ECC. Paying attention to this point, in the present embodiment, the first ECC and the second ECC that are generated from different ECC generation matrices are used. Therefore, according to the data processing device 1, it is possible to improve the detection performance compared with the data error detection only by using the first ECC.

COMPARATIVE EXAMPLE

Figures 2, 3, 4:
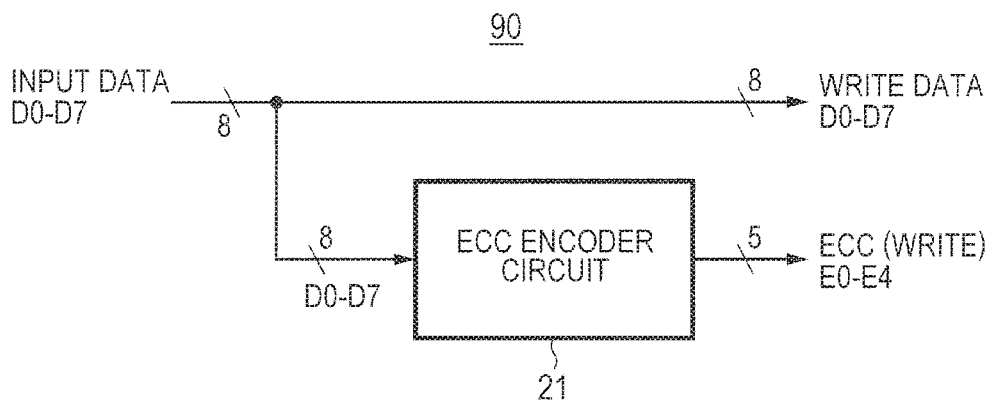
FIG. 2 is a block diagram illustrating an encoder device 90 according to a comparative example.
FIG. 3 is a drawing illustrating an ECC generation matrix used for an ECC encoder circuit 21.
FIG. 4 shows equations expressing operations performed by the ECC generation matrix illustrated in FIG. 3.

Next, a comparative example is explained in order to facilitate understanding of the details of Embodiment. FIG. 2 is a block diagram illustrating an encoder device 90 according to the comparative example. The encoder device 90 generates a 5-bit ECC (E0-E4) from 8-bit input data (D0-D7), as an example. Then, the encoder device 90 outputs the input data (D0-D7) as write data and the generated ECC. The encoder device 90 includes an ECC encoder circuit 21, and generates the ECC by means of the ECC encoder circuit 21.

The ECC encoder circuit 21 generates an ECC capable of the single error correction and double error detection, by performing operations according to an ECC generation matrix illustrated in FIG. 3, for example. The ECC generation matrix illustrated in FIG. 3 is a matrix for generating the 5-bit ECC (E0-E4) from the 8-bit input data (D0-D7) to be written in the memory 6 as the write data. The ECC generation matrix illustrated in FIG. 3 has mutually different bit patterns in each column, and each column includes odd-numbered 1s. Therefore, the ECC generation matrix illustrated in FIG. 3 is a matrix for generating an ECC that is capable of the single error correction and double error detection. Each column of the ECC generation matrix corresponds to each bit of the input data, and each row corresponds to each bit of the ECC to generate.

Specifically, the ECC encoder circuit 21 performs operations illustrated in FIG. 4. FIG. 4 shows equations expressing operations performed by the ECC generation matrix illustrated in FIG. 3. That is, the ECC encoder circuit 21 generates an ECC by multiplying the input data by the ECC generation matrix. When expressed in another way, the ECC encoder circuit 21 generates an ECC by performing XOR (exclusive logical sum) operations of the bit values of the input data about the combination of the bit positions specified by the ECC generation matrix. For example, the combination of the bit positions specified by the first row of the ECC generation matrix is (D0, D1, D2, D3, D4), and the ECC encoder circuit 21 calculates E0 by performing XOR operations on these values.

Figure 5:
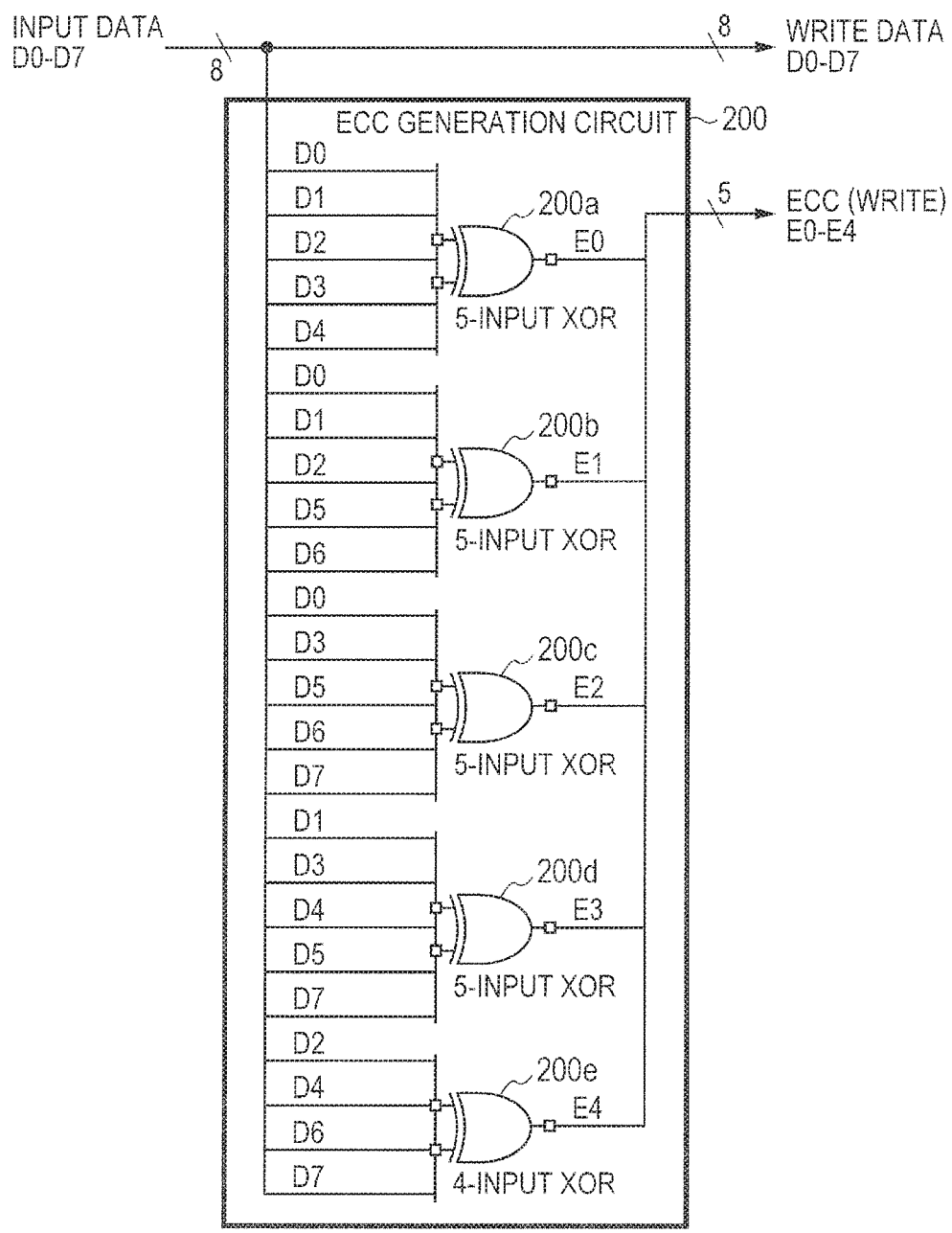
FIG. 5 is a block diagram illustrating an example of a concrete circuit configuration of the ECC encoder circuit 21.

FIG. 5 is a block diagram illustrating an example of a concrete circuit configuration of the ECC encoder circuit 21. As described above, the ECC encoder circuit 21 generates the 5-bit ECC (E0-E4) from the 8-bit input data (D0-D7) by performing XOR operations according to the ECC generation matrix illustrated in FIG. 3. The ECC encoder circuit 21 includes an ECC generation circuit 200 and generates the ECC by means of the ECC generation circuit 200. As illustrated in FIG. 5, the ECC generation circuit 200 is configured with five XOR circuits 200a-200e. The XOR circuits 200a-200d are 5-input XOR circuits, and the XOR circuit 200e is a 4-input XOR circuit. The XOR circuits 200a-200e correspond to the arithmetic expressions illustrated in FIG. 4, respectively, and each determines a value of one bit out of the 5-bit ECC (E0-E4).

E0 is obtained as an output of the XOR circuit 200a. Specifically, the XOR circuit 200a calculates the XOR of D0, D1, D2, D3, and D4 and outputs the calculated result as E0. In the same manner, E1 is obtained as an output of the XOR circuit 200b. E2 is obtained as an output of the XOR circuit 200c. E3 is obtained as an output of the XOR circuit 200d. E4 is obtained as an output of the XOR circuit 200e. The data (D0-D7) and the ECC (E0-E4) outputted from the ECC encoder circuit 21 are stored in the memory 6.

Figures 6, 7, 8:
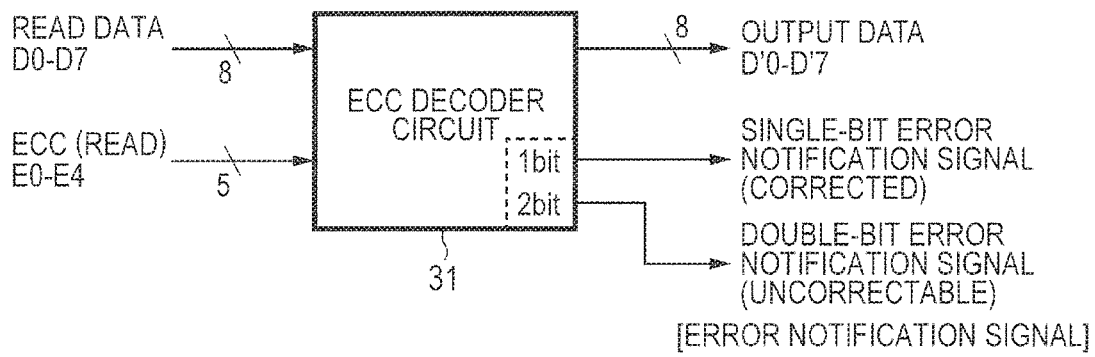
FIG. 6 is a block diagram illustrating a decoder device 91 according to the comparative example.
FIG. 7 is a drawing illustrating an ECC check matrix used for an ECC decoder circuit 31.
FIG. 8 shows equations expressing operations performed by the ECC check matrix illustrated in FIG. 7.

FIG. 6 is a block diagram illustrating a decoder device 91 according to the comparative example. The data (D0-D7) read from the memory 6 and the ECC (E0-E4) similarly read from the memory 6 are inputted into an ECC decoder circuit 31 of the decoder device 91. Based on the read data (D0-D7) and the ECC (E0-E4) that have been inputted, the ECC decoder circuit 31 determines the presence or absence of an error of the read data (D0-D7) and the ECC (E0-E4) and outputs an error notification signal. When it is detected that a single-bit error is included in the read data, the ECC decoder circuit 31 of the decoder device 91 outputs data of which the single-bit error has been corrected, as the output data (D'0-D'7). In the other cases, the ECC decoder circuit 31 outputs the inputted read data as the output data (D'0-D'7).

The ECC decoder circuit 31 outputs an error notification signal according to the presence or absence of the error. Specifically, the ECC decoder circuit 31 outputs "a single-bit error notification signal" indicative of whether the single-bit error is included in the bit string composed of the read data and the ECC, and "a double-bit error notification signal" indicative of whether a two or more-bit error is included in the bit string. When the single-bit error notification signal is 1 and the double-bit error notification signal is 0, the ECC decoder circuit 31 notifies that the bit string has a single-bit error, and that the error-corrected data for the read data is outputted as the output data (D'0-D'7). When the single-bit error notification signal is 0 and the double-bit error notification signal is 1, the ECC decoder circuit 31 notifies that the data that may have an error is outputted as the output data (D'0-D'7). When the single-bit error notification signal is 0 and the double-bit error notification signal is also 0, the ECC decoder circuit 31 notifies that the read data with no error is outputted as the output data (D'0-D'7).

The ECC decoder circuit 31 generates a syndrome code by performing operations according to an ECC check matrix illustrated in FIG. 7, for example, and generates an error notification signal and corrects the error, based on the generated syndrome code. The ECC check matrix illustrated in FIG. 7 is a matrix for generating a 5-bit syndrome code (S0-S4) from the 8-bit read data (D0-D7) and the 5-bit ECC (E0-E4), read from the memory 6. The ECC check matrix is a matrix that combines the unit matrix to the ECC generation matrix. Each column of the ECC check matrix corresponds to each bit of the input data (the read data and the ECC), and each row corresponds to each bit of the syndrome code to be generated.

Specifically, the ECC decoder circuit 31 performs operations illustrated in FIG. 8. FIG. 8 shows equations expressing operations performed by the ECC check matrix illustrated in FIG. 7. That is, the ECC decoder circuit 31 generates the syndrome code by multiplying the input data (the read data and the ECC) by the ECC check matrix. When expressed in another way, the ECC decoder circuit 31 generates the syndrome code by performing XOR operations of the bit values of the input data, about the combination of the bit positions specified by the ECC check matrix. For example, the combination of the bit positions specified by the first row of the ECC check matrix is (D0, D1, D2, D3, D4, E0), and the ECC decoder circuit 31 calculates S0 by performing XOR operations on these values.

Figure 9:
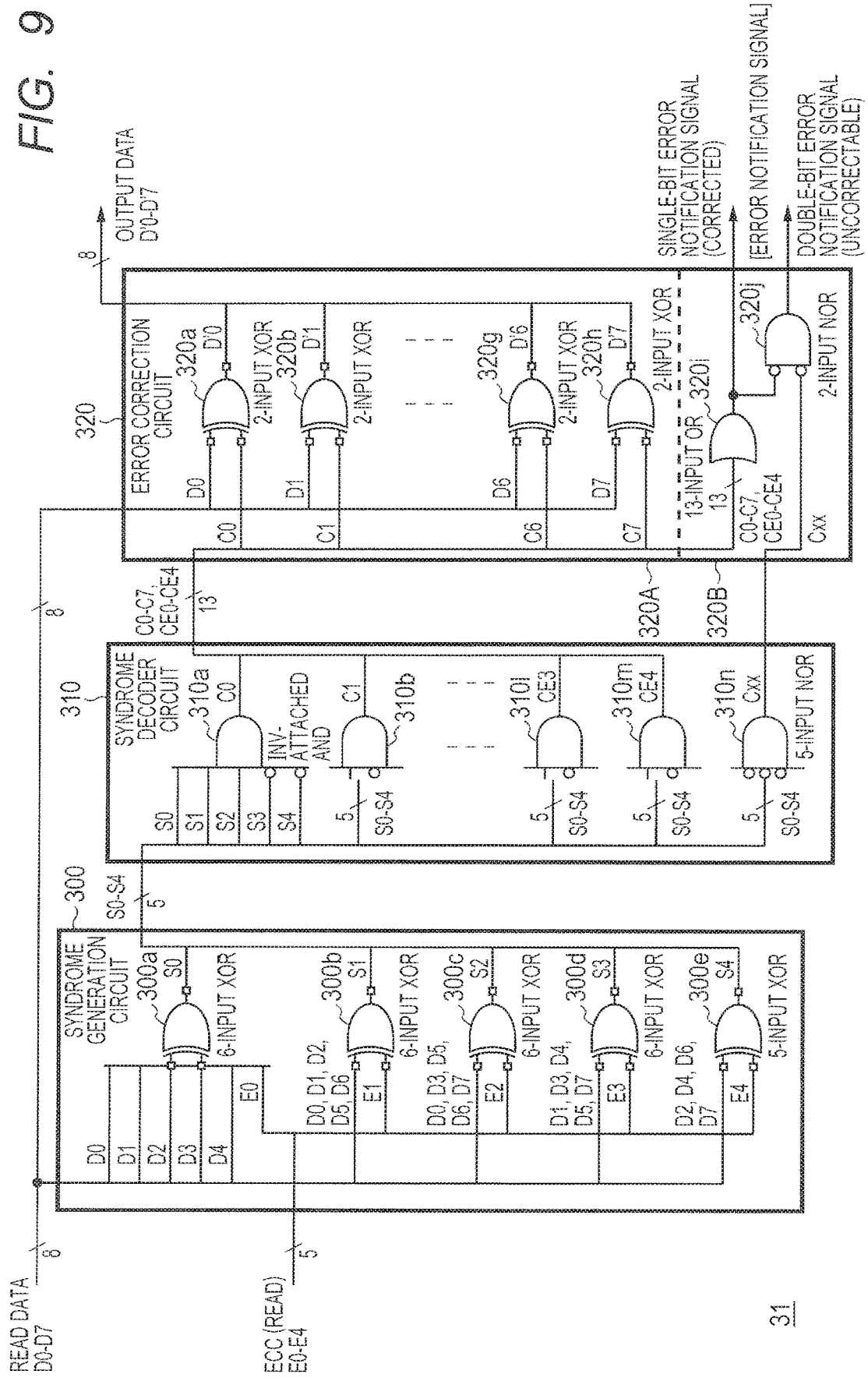
FIG. 9 is a block diagram illustrating an example of a concrete circuit configuration of the ECC decoder circuit 31.

FIG. 9 is a block diagram illustrating an example of a concrete circuit configuration of an ECC decoder circuit 31. The ECC decoder circuit 31 includes a syndrome generation circuit 300, a syndrome decoder circuit 310, and an error correction circuit 320.

The syndrome generation circuit 300 generates and outputs a 5-bit syndrome code (S0-S4) from the 8-bit read data (D0-D7) and the 5-bit ECC (E0-E4). As illustrated in FIG. 9, the syndrome generation circuit 300 is configured with five XOR circuits 300a-300e. The XOR circuits 300a-300d are 6-input XOR circuits, and the XOR circuit 300e is a 5-input XOR circuit. The XOR circuits 300a-300e correspond to the arithmetic expressions illustrated in FIG. 8, respectively, and each determines a value of one bit out of the 5-bit syndrome code (S0-S4).

S0 is obtained as an output of the XOR circuit 300a. Specifically, the XOR circuit 300a calculates the XOR of D0, D1, D2, D3, D4, and E0 and outputs the calculated result as S0. In the same manner, S1 is obtained as an output of the XOR circuit 300b. S2 is obtained as an output of the XOR circuit 300c. S3 is obtained as an output of the XOR circuit 300d. S4 is obtained as an output of the XOR circuit 300e. The syndrome code (S0-S4) outputted from the syndrome generation circuit 300 is inputted into the syndrome decoder circuit 310.

The syndrome decoder circuit 310 decodes the 5-bit syndrome code (S0-S4) and generates and outputs a 13-bit "error bit position flag" (C0-C7, CE0-CE4) and a 1-bit "no error flag" (Cxx). As illustrated in FIG. 9, the syndrome decoder circuit 310 is configured with 13 INV (inverter)- attached AND (logical product) circuits 310a-310m and a NOR (non-disjunction) circuit 310n.

The INV-attached AND circuits 310a-310m are 5-input INV-attached AND circuits. The INV-attached AND circuits 310a-310m output 1 respectively, when the 5-bit bit pattern appearing in each column of the ECC check matrix shown in FIG. 7 (specifically, 13 columns of D0-D7 and E0-E4 illustrated in FIG. 7) matches with the bit pattern of the 5-bit syndrome code (S0-S4) (corresponding to S0-S4 illustrated in FIG. 7). Such operations of the syndrome decoder circuit 310 on the INV-attached AND circuits 310a-310h for outputting the error bit position flag (C0-C7) are equivalent to checking the match between the 5-bit bit pattern appearing in each column of the ECC generation matrix illustrated in FIG. 3 (specifically, eight columns of D0-D7 illustrated in FIG. 3) and the bit pattern of the 5-bit syndrome code (S0-S4) (corresponding to E0-E4 illustrated in FIG. 3). When the bit pattern of the syndrome code matches with the bit pattern of any one of columns of the ECC check matrix (specifically, 13 columns of D0-D7 and E0-E4 illustrated in FIG. 7), it is determined that a single-bit error has occurred in the bit position corresponding to the column (any one of bits of D0-D7 and E0-E4). Each of the INV-attached AND circuits 310a-310h outputs an error bit position flag (C0-C7). Each of the INV-attached AND circuits 310i-310m outputs an error bit position flag (CE0-CE4). The error bit position flag (C0-C7) is a flag indicative of the position of the single-bit error occurred in the read data (D0-D7), and the error bit position flag (CE0-CE4) is a flag indicative of the position of the single-bit error occurred in the ECC (E0-E4).

There are the following two kinds of output patterns of the error bit position flag.

The first output pattern expresses that all C0-C7 and CE0-CE4 are 0. This is the output pattern in the case where no error is detected or where a two or more-bit error is detected.

The second output pattern expresses that any one of C0-C7 and CE0-CE4 is 1. This is the output pattern in the case where single-bit error is detected.

When referred to the first column of the ECC check matrix illustrated in FIG. 7, the bit pattern is (11100). Corresponding to this, in the syndrome decoder circuit 310, the INV-attached AND circuit 310a to generate the error bit position flag C0 is provided. Specifically, among the input ports of the INV-attached AND circuit 310a, S0, S1, and S2 of the syndrome code are coupled to three INV-unattached input ports, and S3 and S4 of the syndrome code are coupled to two INV-attached input ports. A similar coupling is made for the INV-attached AND circuits 310b-310m.

The NOR circuit 310n is a 5-input NOR circuit. The NOR circuit 310n output 1 when the value of all the bits of the 5-bit syndrome code (S0-S4) is 0. When the value of all the bits of the syndrome code (S0-S4) is 0, it is determined that there occurs no bit error. The NOR circuit 310n outputs a no error flag (Cxx). There are the following two kinds of output patterns of the no error flag.

The first output pattern is an output pattern of Cxx=1. This is the output pattern in the case where no error is detected, as described above.

The second output pattern is an output pattern of Cxx=0. This is the output pattern in the case where one or more-bit error is detected.

In this way, in the SEC-DED code, it is possible to detect a single-bit error by detecting that the bit pattern of the syndrome code matches with any one of the bit patterns of the ECC generation matrix. It is also possible to detect a two or more-bit error by detecting that the bit pattern of the syndrome code does not match with any bit pattern of the ECC generation matrix and is not 0 altogether.

The error correction circuit 320 includes a correcting unit 320A that configures the circuit for correcting the error when a single-bit error of the read data is detected, and a notification processing unit 320B that configures the circuit for generating an error notification signal.

The correcting unit 320A performs error correction based on the 8-bit read data (D0-D7) and the 8-bit error bit position flag (C0-C7) and outputs the 8-bit output data (D' 0-D' 7). When the error correction is performed, the output data (D'0-D'7) is the corrected data, and when the error correction is not performed, the output data (D'0-D'7) is the same as the read data (D0-D7). As illustrated in FIG. 9, the correcting unit 320A is configured with eight XOR circuits 320a-320h. The XOR circuits 320a-320h are 2-input XOR circuits. Each of the XOR circuits 320a-320h corrects a single-bit error by performing XOR operations of the error bit position flag and the bit of the read data corresponding to the error bit position flag. That is, the correcting unit 320A performs the single error correction by inverting the value of the corresponding bit position (any one of bits D0-D7) of the read data (D0-D7) when any one of flags of the 8-bit error bit position flag (C0-C7) is 1.

The notification processing unit 320B outputs a "single-bit error notification signal" and a "double-bit error notification signal" as the error notification signal, based on the 13-bit error bit position flag (C0-C7 and CE0-CE4) and the 1-bit no error flag (Cxx). As illustrated in FIG. 9, the notification processing unit 320B is configured with an OR (logical addition) circuit 320i and a NOR circuit 320j. The OR circuit 320i is a 13-input OR circuit, and receives the 13-bit bit position flag (C0-C7 and CE0-CE4). The NOR circuit 320j is a 2-input NOR circuit, and receives the output of the OR circuit 320i and the no error flag (Cxx).

The OR circuit 320i outputs 1 as the single-bit error notification signal when any one of flags of the 13-bit bit position flag (C0-C7 and CE0-CE4) inputted is 1. The NOR circuit 320j outputs 1 as the double-bit error notification signal when both the output of the OR circuit 320i and the no error flag (Cxx) are 0. There are the following three kinds of the output patterns of the error notification signal by the notification processing unit 320B.

The first output pattern is an output pattern in which both the single-bit error notification signal and the double-bit error notification signals are 0. The error notification signal of such an output pattern indicates that the read data (D0-D7), and hence, the output data (D'0-D'7) does not include an error.

The second output pattern is an output pattern in which the single-bit error notification signal is 1 and the double-bit error notification signal is 0. The error notification signal of such an output pattern indicates that the bit string composed of the read data and the ECC includes a single-bit error and that the output data (D'0-D'7) does not include an error.

The third output pattern is an output pattern in which the single-bit error notification signal is 0 and the double-bit error notification signal is 1. The error notification signal of such an output pattern indicates that the bit string composed of the read data and the ECC includes a two or more-bit error, and that the output data (D'0-D'7) includes possibly this error.

FIG. 10 is a table summarizing error detection misses occurring in the algorithm of the error detection according to the comparative example. Specifically, FIG. 10 is a table of verification result by having simulated the number of the cases where, when a bit error has occurred in a total of 13-bit data of the read data (D0-D7) and the ECC (E0-E4), the bit error cannot be detected and is missed (making an erroneous detection indicating that no bit error has occurred). Here, the bit error means the error that the value of any one of bits reverses (the value of a bit changes from 0 to 1 or from 1 to 0). In this table, n is the total number of bits (namely, n=13), k is the number of bits of which an error occurs (k=0, 1, ..., 13), C (n, k) is the total number of combination that an error occurs in k bits among n bits, W(k) is the number of the cases where missing occurs in k bit errors, and Pk is a detection miss probability to k bit errors.

In the error detection using the ECC, the detection of an odd-numbered bit error is possible 100% theoretically. In the case of no bit error (k=0) and the case of double-bit error (k=2), detection of the bit errors is possible 100% theoretically. Accordingly, W(0) and W(2) are zero in the detection miss number of the table. On the other hand, this table shows that an even-numbered bit error of 4 bits or more is unable to detect and missed with a certain amount of probability (percentage), such as the detection miss number W(4) of 4-bit error (k=4) is 55.

FIG. 11 is a table summarizing the number of the cases of erroneous correction occurring in the algorithm of the error detection according to the comparative example (that is, the cases where the multi-bit error has occurred but the error is erroneously detected to be a single-bit error and some normal bit is erroneously corrected). Specifically, FIG. 11 shows the table that summarizes the number of the cases of erroneous correction derived from the result illustrated in FIG. 10, when a bit error occurs in the data of 13 bits in total of the read data (D0-D7) and the ECC (E0-E4). In the table illustrated in FIG. 11, X(k) is the number of the cases where erroneous correction occurs when a k-bit error has occurred, and Qk is erroneous correction probability for the k-bit error.

In the error detection using the ECC, detection of the odd-numbered bit error is possible 100% theoretically, that is, it will never happen that the error is not detected and missed. However, such erroneous correction may happen. As illustrated in FIG. 10, an even-numbered bit error may be missed; accordingly, the following erroneous correction may occur, for example. Consider the case where the 4-bit error (k=4) of the detection miss number W(4)=55 is missed, as an example. Here, it is assumed to determine that no error occurs, when errors occur simultaneously in the total of 4 bits of the b1-th bit, the b2-th bit, the b3-th bit, and the b4-th bit of the 13-bit data. The values of b1, b2, b3, and b4 are defined naturally by how each column of the ECC generation matrix is set up.

In this case, when only any three bits of the bit positions among b1, b2, b3, and b4 in certain data have errors, an erroneous determination will be made as if an error has occurred only in the bit of the remaining bit position. For example, when the b1-th bit, the b2-th bit, and the b3-th bit have errors and the remaining 10 bits including the b4-th bit have no error, an erroneous determination will be made as if only the b4-th bit has an error. That is, an erroneous determination will be made as if a single-bit error has occurred, and correction will be made for the one bit determined to have an error (the b4-th bit in the above example). That is, the erroneous correction to a normal bit will be made. At this time, the fact that the error has occurred in the remaining three bits will be missed. Thereby, the erroneous correction number X(3) to the three bits (k=3) is 4 times the number of W(4), that is 220.

Consider the case where another single-bit error has occurred, to a 4-bit error (k=4) of which the detection is missed. That is, consider the case where errors have occurred simultaneously in the total of 5 bits of the b1-th bit, the b2-th bit, the b3-th bit, the b4-th bit, and the b5-th bit of the 13-bit data. In this case, an erroneous determination will be made as if an error has occurred only in the b5-th bit, in other words, as if a single-bit error has occurred. Therefore, the b5-th bit is corrected correctly, however, the fact that the error has occurred in 4 bits (the b1-th bit, the b2-th bit, the b3-th bit, and the b4-th bit) is missed. This is also considered to be a kind of the erroneous correction. Accordingly, In the table illustrated in FIG. 11, 9 (=13-4) times the number of W(4), that is 495, are added in the erroneous correction number X(5) of the 5-bit error (k=5). As the erroneous correction number that contributes to X(5) in addition to this, the erroneous correction of 6 times W(6), that is 576, is possible to occur, in a similar way of thinking as described above. Therefore, the erroneous correction number X(5) is given by 1071 (=495+576). The erroneous correction numbers other than X(5) are obtained in a similar way. It is seen from the table illustrated in FIG. 11 that erroneous correction occurs with a considerably large amount of probability (percentage) in the case of the three or more odd-numbered bit error.

Embodiment 1

Figure 12:
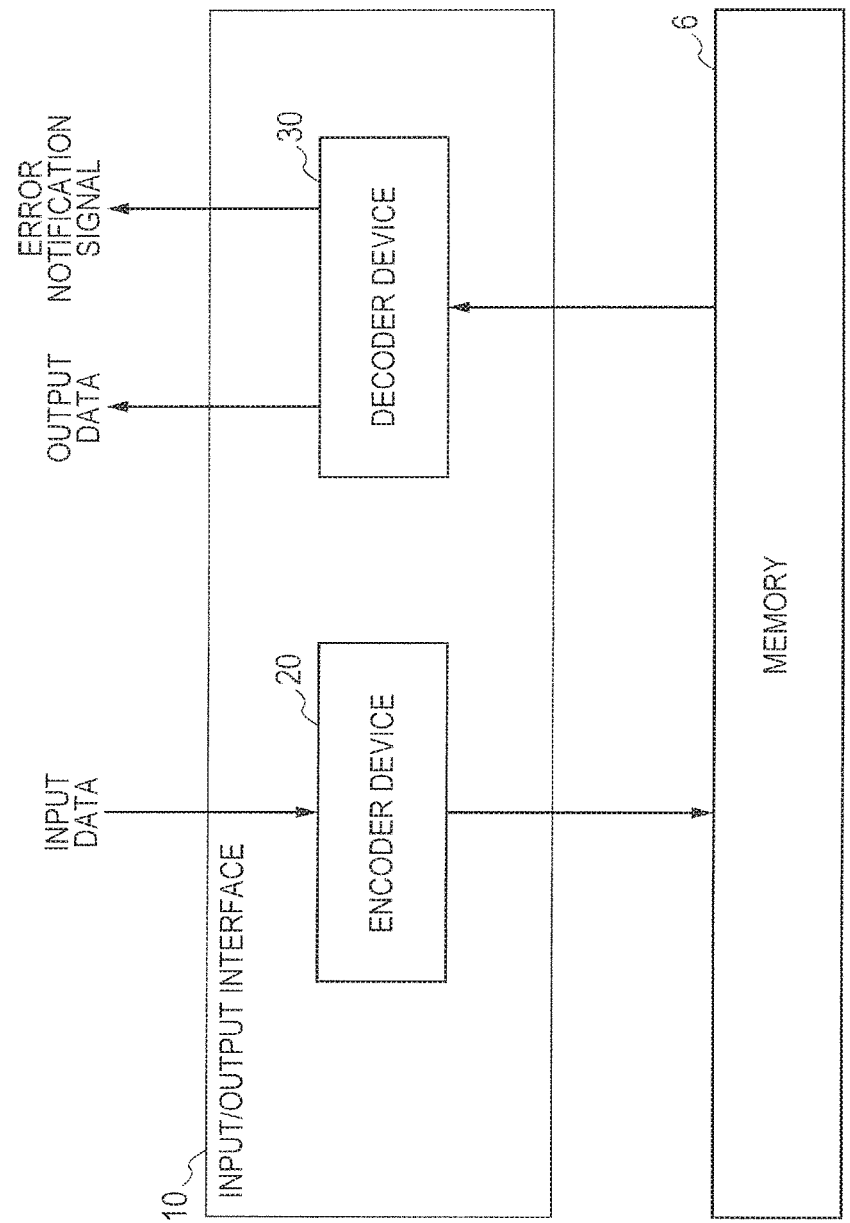
FIG. 12 is a block diagram illustrating an example of a data processing device according to Embodiment.

Next, Embodiment 1 is described. FIG. 12 is a block diagram illustrating an example of a data processing device according to Embodiment 1. In FIG. 12, an input/output interface 10 corresponds to the data processing device 1 illustrated in FIG. 1. The input/output interface 10 is an interface for the input-output to the memory 6. For example, the input/output interface 10 is provided in an SOC (System-on-a-chip) and is provided between a bus system of the SOC and the memory 6 as an external memory, such as a DDR (Double Data Rate) memory. It is obvious that the error detection/correction function by the input/output interface 10 may be applied not only to the external memory 6 but also to the memory 6 built in the SOC, etc.

As illustrated in FIG. 12, the input/output interface 10 includes an encoder device 20 and a decoder device 30. The encoder device 20 corresponds to the encoder device 2 illustrated in FIG. 1. The encoder device 20 performs the processing to be described later to the input data to be written in the memory 6, and stores the processing result in the memory 6. The decoder device 30 corresponds to the decoder device 3 illustrated in FIG. 1. The decoder device 30 performs the processing to be described later to the data read from the memory 6, and outputs output data and an error notification signal.

Figures 13, 14:
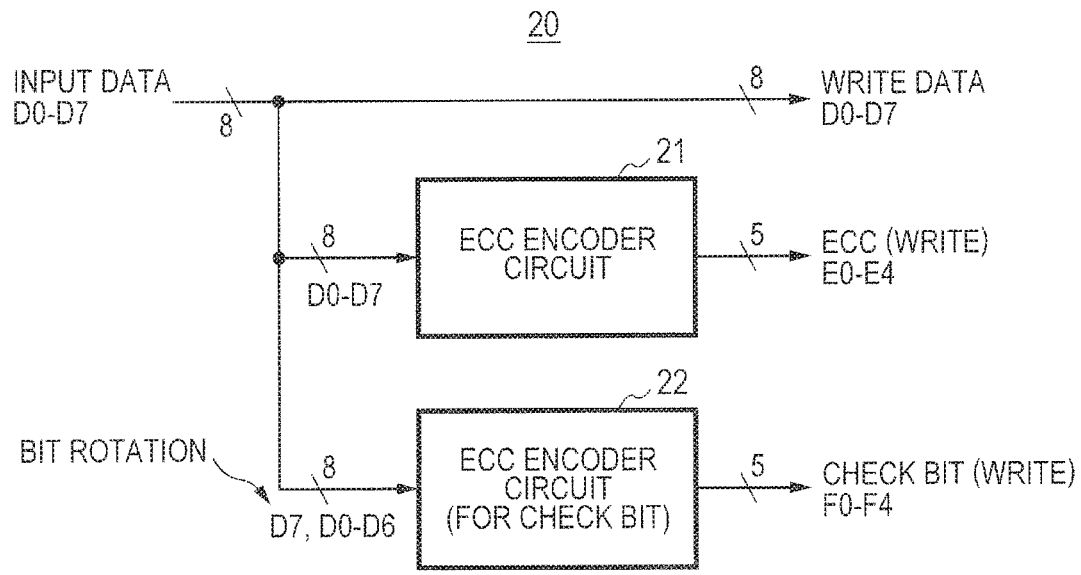
FIG. 13 is a block diagram illustrating an encoder device 20.
FIG. 14 is a drawing illustrating an ECC generation matrix used for an ECC encoder circuit 22.

FIG. 13 is a block diagram illustrating the encoder device 20. As illustrated in FIG. 13, the encoder device 20 includes an ECC encoder circuit 21 and an ECC encoder circuit 22. The ECC encoder circuit 21 generates an ECC capable of the single error correction and double error detection, by performing operations according to a first ECC generation matrix. The ECC encoder circuit 22 generates an ECC as a check bit, capable of the single error correction and double error detection, by performing operations according to a second ECC generation matrix obtained by permutating a column of the first ECC generation matrix. The ECC encoder circuit 21 and the ECC encoder circuit 22 have the same circuit configuration; however, they generate different ECCs because the bit order of the data inputted are different.

The ECC encoder circuit 21 of the encoder device 20 is the same as the ECC encoder circuit 21 included in the encoder device 90 according to the comparative example.

Therefore, the ECC encoder circuit 21 performs operations using the ECC generation matrix illustrated in FIG. 3 for example, as the first ECC generation matrix, and generates a 5-bit ECC (E0-E4) from then 8-bit input data (D0-D7). An example of the concrete circuit configuration of the ECC encoder circuit 21 of the encoder device 20 is as illustrated in FIG. 5.

The ECC encoder circuit 22 generates a 5-bit ECC (F0-F4) from the data (D7, D0-D6) obtained by rotating the bit position of the 8-bit input data. That is, the data inputted into the ECC encoder circuit 22 is the data obtained by rotating each bit of the data to be inputted into the ECC encoder circuit 21. The ECC generated by the ECC encoder circuit 22 is used in order to supplement the error detection and correction by the ECC generated by the ECC encoder circuit 21. Accordingly, the ECC generated by the ECC encoder circuit 22 is called a "check bit" in distinction from the ECC generated by the ECC encoder circuit 21. The ECC encoder circuit 22 has the same circuit configuration as the ECC encoder circuit 21, except that the ECC generation matrix to be used is different. That is, the concrete circuit configuration of the ECC encoder circuit 22 is different from that of the ECC encoder circuit 21 in the point that the data (D7, D0-D6) obtained by rotating the bit position of the 8-bit input data is inputted into the ECC encoder circuit 22, and in the point that the output of the ECC encoder circuit 22 becomes the 5-bit check bit (F0-F4) instead of the 5-bit ECC (E0-E4).

When the ECC encoder circuit 21 performs operations according to the ECC generation matrix illustrated in FIG. 3, the ECC encoder circuit 22 generates the ECC (check bit) capable of the single error correction and double error detection, by performing operations according to the ECC generation matrix illustrated in FIG. 14, for example. The ECC generation matrix illustrated in FIG. 14 is a matrix for generating the 5-bit check bit (F0-F4) from the 8-bit input data (D0-D7), and is obtained by rotating each column of the ECC generation matrix illustrated in FIG. 3 by one column to the left. In this way, the rotation in the ECC generation matrix used for the ECC encoder circuit 22 corresponds to the rotation of the data inputted into the ECC encoder circuit 22. That is, the bit position after the rotation in the rotation of the bit for deriving the bit string to be inputted into the ECC encoder circuit 22 corresponds to the column number after the rotation in the rotation of the column for deriving the ECC generation matrix to be used by the ECC encoder circuit 22. The ECC generation matrix illustrated in FIG. 14 is obtained only by rotating the ECC generation matrix illustrated in FIG. 3. Accordingly, as is the case with the ECC generation matrix illustrated in FIG. 3, the bit patterns of each column differ mutually and each column includes odd-numbered pieces of 1's. Accordingly, the ECC generation matrix illustrated in FIG. 14 is also a matrix for generating an ECC capable of the single error correction and double error detection.

Figure 15:
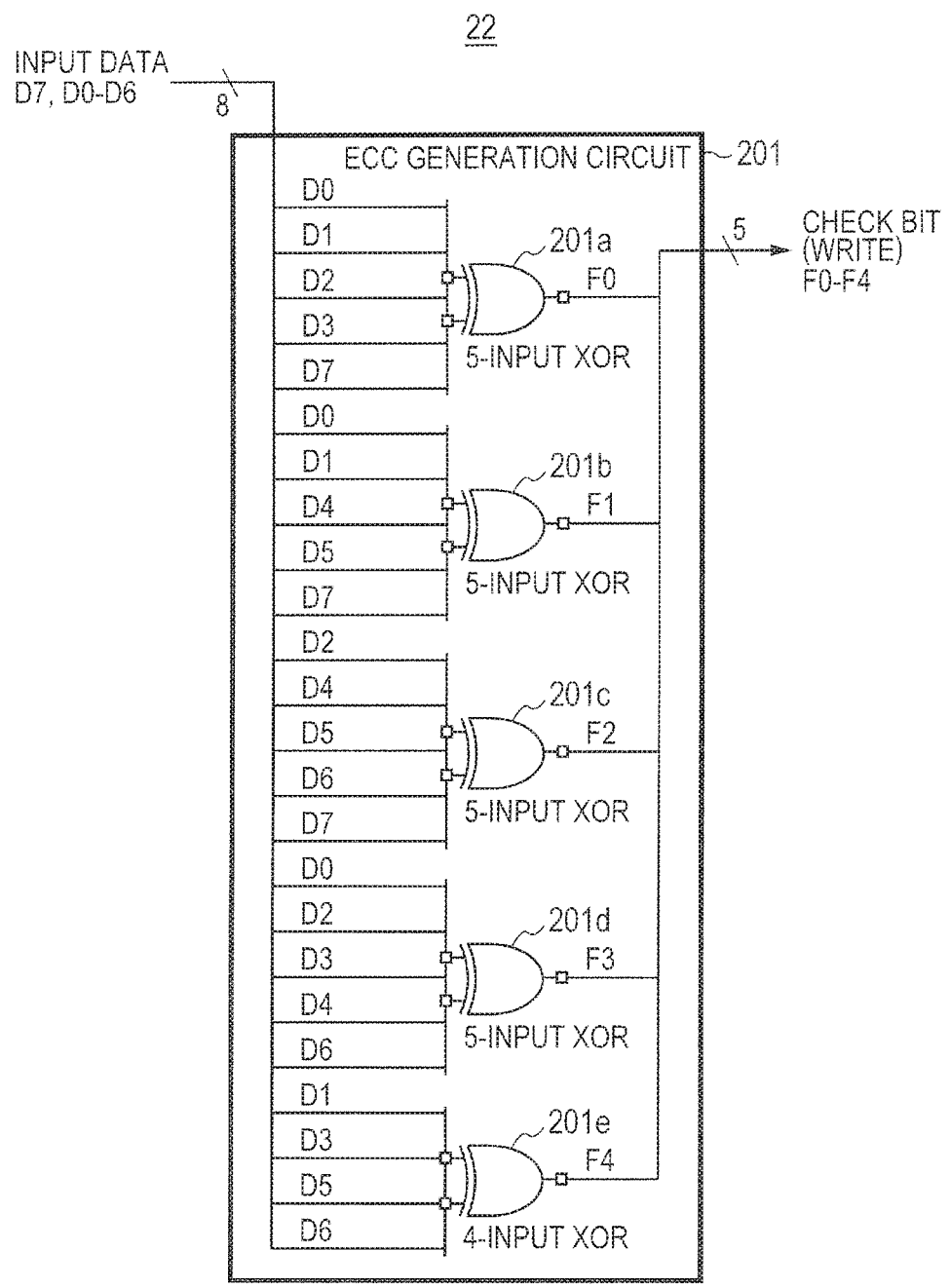
FIG. 15 is a block diagram illustrating an example of a concrete circuit configuration of the ECC encoder circuit 22.

FIG. 15 is a block diagram illustrating an example of a concrete circuit configuration of the ECC encoder circuit 22. As described above, the ECC encoder circuit 22 generates the 5-bit check bit (F0-F4) from the 8-bit input data (D7, D0-D6) by performing XOR operations according to the ECC generation matrix illustrated in FIG. 14. The ECC encoder circuit 22 includes the ECC generation circuit 201 and generates a check bit by means of the ECC generation circuit 201. As is the case with the circuit illustrated in FIG. 5, the ECC generation circuit 201 is configured with five XOR circuits 201a-201e. The XOR circuits 201a-201d are 5-input XOR circuits, and the XOR circuit 201e is a 4-input XOR circuit. Each of the XOR circuits 201a-201e performs operations corresponding to the ECC generation matrix illustrated in FIG. 14 and determines the value of one bit of the 5-bit check bit (F0-F4).

F0 is obtained as an output of the XOR circuit 201a. Specifically, the XOR circuit 201a performs the XOR operations on D0, D1, D2, D3, and D7, and outputs the operation result as F0. Similarly, F1 is obtained as an output of the XOR circuit 201b. F2 is obtained as an output of the XOR circuit 201c. F3 is obtained as an output of the XOR circuit 201d. F4 is obtained as an output of the XOR circuit 201e.

In the example described here, the ECC encoder circuit 22 uses the matrix obtained by rotating each column of the ECC generation matrix used by the ECC encoder circuit 21, by one column to the left. However, the direction of the rotation and the number of stages of the rotation are not restricted to the above-described example. However, in this case, as described above, the data to be inputted into the ECC encoder circuit 22 needs to be the data obtained by performing the same rotation as the rotation performed for the ECC generation matrix, to the data inputted into the ECC encoder circuit 21.

The encoder device 20 stores, into the memory 6, the input data as the 8-bit write data (D0-D7), together with the generated 5-bit ECC (E0-E4) and the generated 5-bit check bit (F0-F4).

Figure 16:
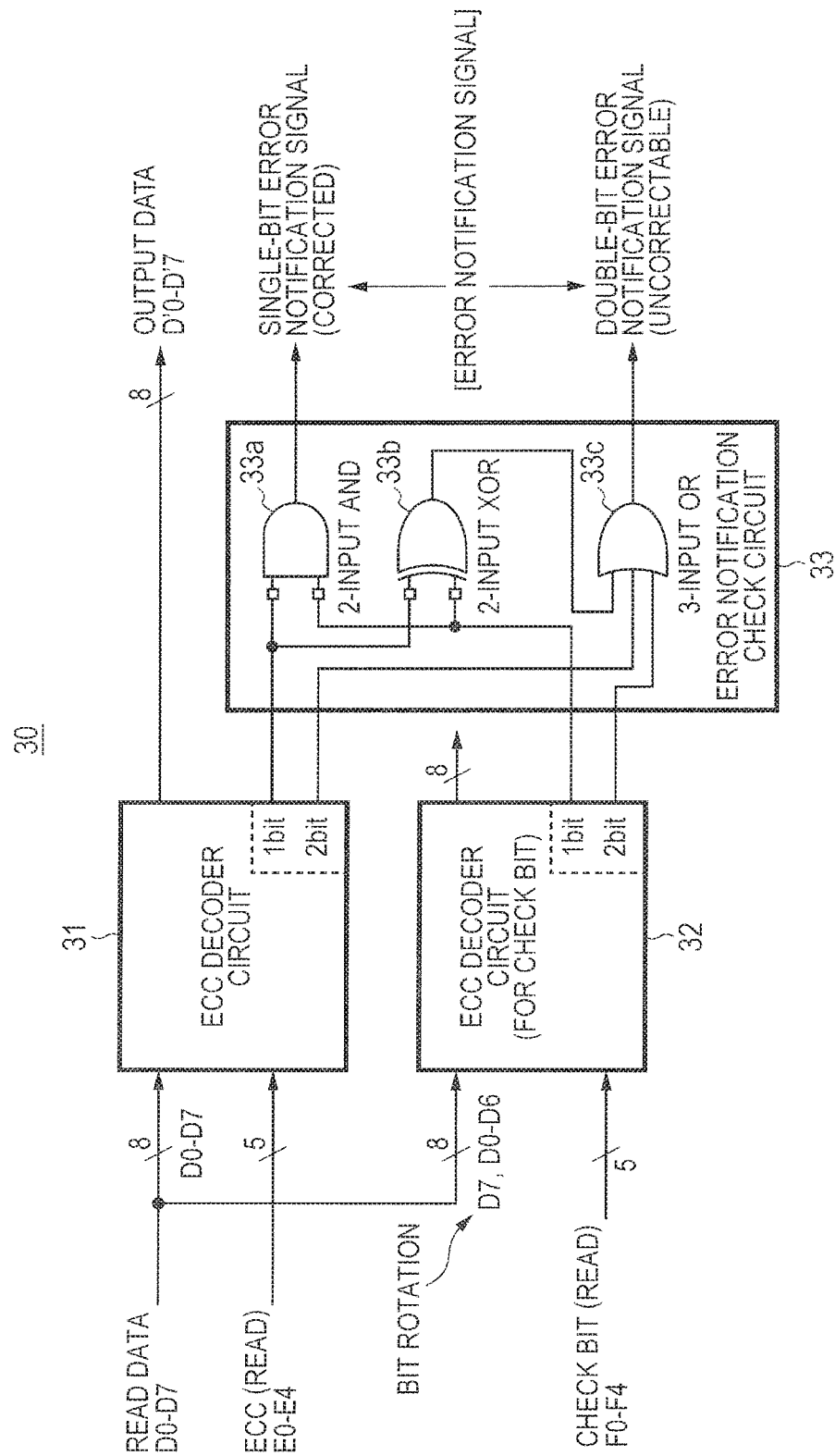
FIG. 16 is a block diagram illustrating a decoder device 30.

Next, the decoder device 30 is explained. FIG. 16 is a block diagram illustrating the decoder device 30. The decoder device 30 includes an ECC decoder circuit 31, an ECC decoder circuit 32, and an error notification check circuit 33. The ECC decoder circuit 31 and the ECC decoder circuit 32 have the same circuit configuration. However, the bit order of the data to be inputted is different; accordingly, the objects to decode are different. The ECC decoder circuit 31 receives the read data (D0-D7) and the ECC (E0-E4), read from the memory 6. The ECC decoder circuit 32 receives data (D7, D0-D6) obtained by permutating bits of the read data (D0-D7) read from the memory 6, in the same manner as for the data that has been inputted into the ECC encoder circuit 22, and the check bit (F0-F4) read from the memory 6.

The ECC decoder circuit 31 is the same as the ECC decoder circuit 31 included in the decoder device 91 according to the comparative example. Therefore, the ECC decoder circuit 31 performs the single error correction and double error detection to the 8-bit read data (D0-D7) and the 5-bit ECC (E0-E4), read from the memory 6. When a single-bit error is detected, the error of the bit is corrected. The ECC decoder circuit 32 performs the single error correction and double error detection to the data (D7, D0-D6) obtained by rotating the bit position of the 8-bit read data read from the memory 6, and the 5-bit check bit (F0-F4). The ECC decoder circuit 32 has the same circuit configuration as the ECC decoder circuit 31, except that the ECC check matrix to use is different. That is, while the ECC decoder circuit 31 performs operations according to the first ECC check matrix, the ECC decoder circuit 32 performs operations according to the second ECC check matrix.

FIG. 17 illustrates an ECC check matrix used for the ECC decoder circuit 31 of the decoder device 30. As is the case with the ECC check matrix used for the ECC decoder circuit 31 of the decoder device 91 according to the comparative example, the ECC check matrix used for the ECC decoder circuit 31 of the decoder device 30 is a matrix for generating a 5-bit syndrome code (S0-S4) from the 8-bit read data (D0-D7) and the 5-bit ECC (E0-E4). The ECC check matrix illustrated in FIG. 17 includes the columns (drawn with oblique lines) corresponding to the check bit (F0-F4) of which the elements are filled with 0 because they are not used for operations. 13 columns not drawn with oblique lines on the left-hand side have the same contents as the ECC check matrix illustrated in FIG. 7.

FIG. 18 illustrates an ECC check matrix used for the ECC decoder circuit 32 of the decoder device 30. The ECC check matrix used for the ECC decoder circuit 32 of the decoder device 30 is a matrix for generating a 5-bit syndrome code (R0-R4) from the 8-bit read data (D0-D7) and the 5-bit check bit (F0-F4). The ECC check matrix illustrated in FIG. 18 includes the columns (drawn with oblique lines) corresponding to the ECC (E0-E4) of which the elements are filled with 0 because they are not used for operations. Eight columns (columns corresponding to D0-D7) on the left-hand side of the columns drawn with oblique lines have the contents that are obtained by rotating each of eight columns (columns corresponding to D0-D7) on the left-hand side of the ECC check matrix illustrated in FIG. 17, by one column to the left. In this way, as for the ECC check matrix used for the ECC decoder circuit 32, the permutation of the column is performed, corresponding to the permutation of the column of the ECC generation matrix used for the ECC encoder circuit 22 in the encoder device 20.

FIG. 18 illustrates the ECC check matrix used by the ECC decoder circuit 32, when the ECC encoder circuit 22 uses the matrix that is obtained by rotating each column of the ECC generation matrix used by the ECC encoder circuit 21 by one column to the left. Therefore, corresponding to the direction of the rotation and the number of stages of the rotation, the ECC check matrix used by the ECC decoder circuit 32 is different.

An example of the concrete circuit configuration of the ECC decoder circuit 31 of the decoder device 30 is as illustrated in FIG. 9, and the ECC decoder circuit 31 includes the syndrome generation circuit 300, the syndrome decoder circuit 310, and the error correction circuit 320. That is, operations according to the ECC check matrix illustrated in FIG. 17 are performed by the syndrome generation circuit 300 illustrated in FIG. 9.

Figure 19:
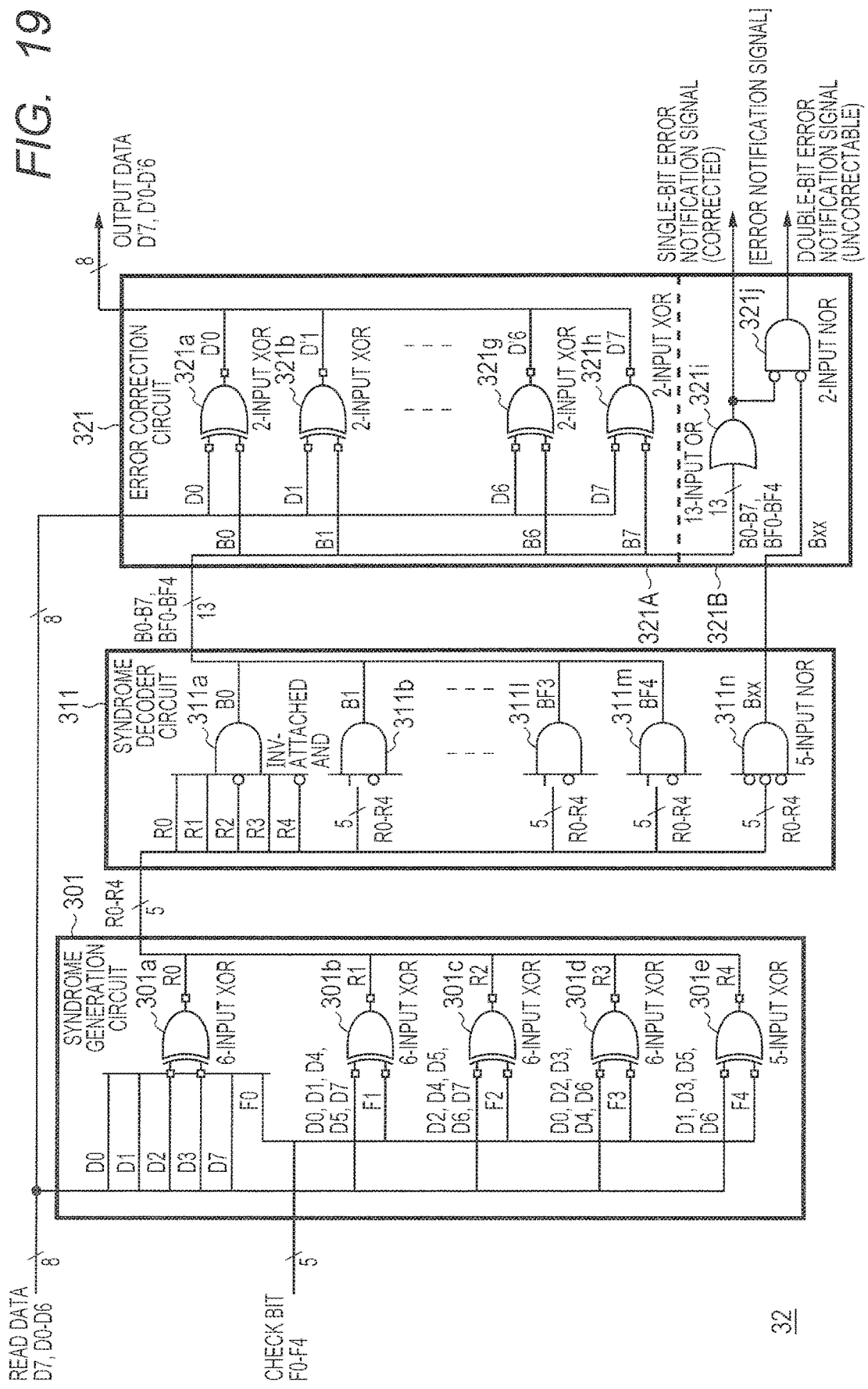
FIG. 19 is a block diagram illustrating an example of a concrete circuit configuration of the ECC decoder circuit 32.

The concrete circuit configuration of the ECC decoder circuit 32 of the decoder device 30 is the same as that of the ECC decoder circuit 31 except that the ECC check matrix to be used is different. FIG. 19 is a block diagram illustrating an example of the concrete circuit configuration of the ECC decoder circuit 32. The ECC decoder circuit 32 includes a syndrome generation circuit 301, a syndrome decoder circuit 311, and an error correction circuit 321.

The syndrome generation circuit 301 is the same as the syndrome generation circuit 300 except for the following three points. First, the syndrome generation circuit 301 receives the data (D7, D0-D6) obtained by rotating the bit position of the 8-bit read data. Second, the syndrome generation circuit 301 receives not the 5-bit ECC but the 5-bit check bit (F0-F4). Third, the syndrome generation circuit 301 outputs not the 5-bit syndrome code (S0-S4) but the 5-bit syndrome code (R0-R4).

Therefore, the syndrome generation circuit 301 generates and outputs the 5-bit syndrome code (R0-R4) from the 8-bit data (D7, D0-D6) and the 5-bit check bit (F0-F4). As is the case with the circuit illustrated in FIG. 9, the syndrome generation circuit 301 is configured with five XOR circuits 301a-301e. The XOR circuits 301a-301d are 6-input XOR circuits, and the XOR circuit 301e is a 5-input XOR circuit. Each of the XOR circuits 301a-301e performs operations according to the ECC check matrix illustrated in FIG. 18 and determines the value of one bit of the 5-bit syndrome code (R0-R4).

R0 is obtained as the output of the XOR circuit 301a. Specifically, the XOR circuit 301a performs the XOR operations on D0, D1, D2, D3, D7, and F0, and outputs the operation result as R0. Similarly, R1 is obtained as the output of the XOR circuit 301b. R2 is obtained as the output of the XOR circuit 301c. R3 is obtained as the output of the XOR circuit 301d. R4 is obtained as the output of the XOR circuit 301e. The syndrome code (R0-R4) outputted from the syndrome generation circuit 301 is inputted into the syndrome decoder circuit 311.

The syndrome decoder circuit 311 is the same as the syndrome decoder circuit 310 except for the following two points. First, the syndrome decoder circuit 311 receives not the syndrome code (S0-S4) but another syndrome code (R0-R4). Second, the syndrome decoder circuit 311 outputs not the error bit position flag (C0-C7, CE0-CE4) and the no error flag (Cxx) but another error bit position flag (B0-B7, BF0-BF4) and the no error flag (Bxx).

Therefore, the syndrome decoder circuit 311 decodes the 5-bit syndrome code (R0-R4) and generates and outputs a 13-bit error bit position flag (B0-B7, BF0-BF4) and a 1-bit no error flag (Bxx). As illustrated in FIG. 19, the syndrome decoder circuit 311 is configured with 13 INV-attached AND circuits 311a-311m and a NOR circuit 311n.

The INV-attached AND circuits 311a-311m are 5-input INV-attached AND circuits. The INV-attached AND circuits 311a-311m output 1 respectively, when the 5-bit bit pattern (corresponding to R0-R4 illustrated in FIG. 18) appearing in each column of the ECC check matrix illustrated in FIG. 18 (specifically, 13 columns of D0-D7 and F0-F4 illustrated in FIG. 18) matches with the bit pattern of the 5-bit syndrome code (R0-R4). The single-bit error is detected by detecting that the bit pattern of the syndrome code matches with the bit pattern of any one of columns of the ECC check matrix. The INV-attached AND circuits 311a-311h output respectively the error bit position flag (B0-B7). The INV-attached AND circuits 311i-311m output respectively the error bit position flag (BF0-BF4). The output pattern of the error bit position flag (B0-B7, BF0-BF4) is the same as the output pattern of the error bit position flag (C0-C7, CE0-CE4), and there are the following two kinds.

The first output pattern is the output pattern that all B0-B7 and BF0-BF4 are 0. This is the output pattern in the case where no error is detected and the case where a two or more-bit error is detected.

The second output pattern is the output pattern that any one of B0-B7 and BF0-BF4 is 1. This is the output pattern in the case where a single-bit error is detected.

When the first column of the ECC check matrix illustrated in FIG. 18 is observed, the bit pattern is (1, 1, 0, 1, 0). In order to correspond to this, the syndrome decoder circuit 311 is provided with the INV-attached AND circuit 311a to generate the error bit position flag B0. Specifically, among the input ports of the INV-attached AND circuit 311a, R0, R1, and R3 of the syndrome code are coupled to three INV-unattached input ports, and R2 and R4 of the syndrome code are coupled to two INV-attached input ports. Similar coupling is made for the INV-attached AND circuits 311b-311m.

The NOR circuit 311n is a 5-input NOR circuit. The NOR circuit 311n outputs 1, when the value of all the bits of the 5-bit syndrome code (R0-R4) is 0. When the value of all the bits of the syndrome code (R0-R4) is 0, it is determined that no bit error has occurred. The NOR circuit 311n outputs a no error flag (Bxx). As the output pattern of the no error flag (Bxx), there are the following two kinds same as the output pattern of the no error flag (Cxx).

The first output pattern is that Bxx is 1. This is the output pattern in the case where no error is detected as described above.

The second output pattern is that Bxx is 0. This is the output pattern in the case where one-or-more-bit error is detected.

The error correction circuit 321 is the same as the error correction circuit 320 except for the following two points. First, in the error correction circuit 321, the input is not the error bit position flag (C0-C7, CE0-CE4) and not the no error flag (Cxx) but another error bit position flag (B0-B7, BF0-BF4) and the no error flag (Bxx). Second, the output data (D' 0-D' 7) after the single-bit error correction as the output of the error correction circuit 321 is not used, but only the single-bit error notification signal and the double-bit error notification signal are used. As the output data of the decoder device 30, the output data of the ECC decoder circuit 31 is used.

The error correction circuit 321 includes a correcting unit 321A that composes a circuit to correct the error when a single-bit error of the read data is detected, and a notification processing unit 321B that composes a circuit to generate the error notification signal indicative of the occurrence state of the error of the read data.

The correcting unit 321A performs error correction based on the 8-bit read data (D7, D0-D6) and an 8-bit error bit position flag (B0-B7). Specifically, as is the case with the correcting unit 320A illustrated in FIG. 9, the correcting unit 321A is configured with eight XOR circuits 321a-321h. The XOR circuits 321a-321h are 2-input XOR circuits. Each of the XOR circuits 321a-321h corrects a single-bit error, by performing XOR operations of the error bit position flag and the bit of the read data corresponding to the error bit position flag. That is, when any one of flags of the 8-bit error bit position flag (B0-B7) is 1, the correcting unit 321A performs the single-bit error correction by reversing the value at the corresponding bit position of the read data (D0-D7). In the present embodiment, the ECC decoder circuit 32 having the same circuit configuration as the ECC decoder circuit 31 is used, so that the decoder device 30 may be configured easily. Accordingly, the error correction circuit 321 includes the correcting unit 321A. However, as described above, in the present embodiment, the correcting function of the ECC decoder circuit 32 is not used. Accordingly, the error correction circuit 321 may not include the correcting unit 321A.

The notification processing unit 321B outputs a single-bit error notification signal and a double-bit error notification signal as the error notification signal, based on the 13-bit error bit position flag (B0-B7, BF0-BF4) and the 1-bit no error flag (Bxx). As is the case with the notification processing unit 320B illustrated in FIG. 9, the notification processing unit 321B is configured with an OR circuit 321i and a NOR circuit 321j. The OR circuit 321i is a 13-input OR circuit, and receives the 13-bit bit position flag (B0-B7, BF0-BF4). The NOR circuit 321j is a 2-input NOR circuit, and receives the output of the OR circuit 321i and the no error flag (Bxx).

The OR circuit 321i outputs 1 as the single-bit error notification signal, when any one flag of the inputted 13-bit bit position flag (B0-B7, BF0-BF4) is 1. The NOR circuit 321j outputs 1 as the double-bit error notification signal, when both the output of the OR circuit 321i and the no error flag (Bxx) are 0. As is the case with the output pattern of the error notification signal by the notification processing unit 320B, there are the following three kinds as the output pattern of the error notification signal by the notification processing unit 321B.

The first output pattern is that both the single-bit error notification signal and the double-bit error notification signal are 0. The error notification signal of such an output pattern indicates that the read data (D7, D0-D6) does not include any error.

The second output pattern is that the single-bit error notification signal is 1 and the double-bit error notification signal is 0. The error notification signal of such an output pattern indicates that the bit string composed of the read data (D7, D0-D6) and the check bit (F0-F4) includes a single-bit error.

The third output pattern is that the single-bit error notification signal is 0 and the double-bit error notification signal is 1. The error notification signal of such an output pattern indicates that the bit string composed of the read data (D7, D0-D6) and the check bit (F0-F4) includes a two or more-bit error.

As illustrated in FIG. 16, the error notification signal (the single-bit error notification signal and the double-bit error notification signal) outputted from the error correction circuit 320 of the ECC decoder circuit 31 and the error notification signal (the single-bit error notification signal and the double-bit error notification signal) outputted from the error correction circuit 321 of the ECC decoder circuit 32 are inputted into the error notification check circuit 33. Both the error notification signals outputted from the error correction circuit 320 and the error notification signals outputted from the error correction circuit 321 are signals used for generating the final notification signal by the error notification check circuit 33.

The single-bit error notification signal generated by the error correction circuit 320 can also be called a signal that indicates whether a correctable single-bit error exists in the bit string composed of the read data (D0-D7) and the ECC (E0-E4). The single-bit error notification signal outputted from the error correction circuit 320 is also called the first determination signal.

The double-bit error notification signal generated by the error correction circuit 320 can also be called a signal that indicates whether a two or more-bit error exists in the bit string composed of the read data (D0-D7) and the ECC (E0-E4). The double-bit error notification signal outputted from the error correction circuit 320 is also called the second determination signal.

The single-bit error notification signal generated by the error correction circuit 321 can also be called a signal that indicates whether the correctable single-bit error exists in the bit string composed of the read data (D7, D0-D6) and the check bit (F0-F4). The single-bit error notification signal outputted from the error correction circuit 321 is also called the third determination signal.

The double-bit error notification signal generated by the error correction circuit 321 can also be called a signal that indicates whether a two or more-bit error exists in the bit string composed of the read data (D7, D0-D6) and the check bit (F0-F4). The double-bit error notification signal outputted from the error correction circuit 321 is also called the fourth determination signal.

The error notification check circuit 33 generates a final error notification signal indicative of the occurrence state of an error based on the first to the fourth determination signal described above. The error notification check circuit 33 outputs, as the error notification signal, "the single-bit error notification signal" that indicates whether the single-bit error is included in the read data (D0-D7) and "the double-bit error notification signal" that indicates whether the two or more-bit error is included in the read data (D0-D7). However actually, also when a single-bit error is included in both the ECC (E0-E4) and the check bit (F0-F4), the single-bit error notification signal is set to 1. Also, when a two or more-bit error is included in either the ECC (E0-E4) or the check bit (F0-F4), the double-bit error notification signal is set to 1. When the error notification check circuit 33 outputs the single-bit error notification signal of 1 and the double-bit error notification signal of 0, the decoder device 30 notifies that the bit string has a single-bit error and that the data obtained by correcting the error of the read data is outputted as the output data (D'0-D'7). When the error notification check circuit 33 outputs the single-bit error notification signal of 0 and the double-bit error notification signal of 1, the decoder device 30 notifies that the data that may include an error is outputted as the output data (D'0-D'7). In the present case, the error may have occurred only in the ECC or the check bit. Accordingly, the output data (D'0-D'7) does not necessarily include an error. Furthermore, when the decoder device 30 outputs the single-bit error notification signal of 0 and the double-bit error notification signal of 0, the decoder device 30 notifies that the read data having no error is outputted as the output data (D'0-D'7).

In this way, the decoder device 30 generates the notification signal indicating that the bit string read does not include an error, that the bit string includes a single-bit error, or that the bit string includes a two or more-bit error, based on the read data, the ECC, and the check bit that are read from the memory 6.

As illustrated in FIG. 16, the error notification check circuit 33 is configured with an AND circuit 33a, an XOR circuit 33b, and an OR circuit 33c. The AND circuit 33a is a 2-input AND circuit, the XOR circuit 33b is a 2-input XOR circuit, and the OR circuit 33c is a 3-input OR circuit.

The AND circuit 33a receives the single-bit error notification signal (the first determination signal) generated by the ECC decoder circuit 31 and the single-bit error notification signal (the third determination signal) generated by the ECC decoder circuit 32. The AND circuit 33a performs AND operations on these inputs and outputs the obtained signal as the final single-bit error notification signal.

The XOR circuit 33b receives the single-bit error notification signal (the first determination signal) generated by the ECC decoder circuit 31 and the single-bit error notification signal (the third determination signal) generated by the ECC decoder circuit 32. The XOR circuit 33b performs XOR operations on these inputs and outputs the obtained signal to the OR circuit 33c.

The OR circuit 33c receives the double-bit error notification signal (the second determination signal) generated by the ECC decoder circuit 31, the double-bit error notification signal (the fourth determination signal) generated by the ECC decoder circuit 32, and the output signal of the XOR circuit 33b. The OR circuit 33c performs OR operations on these inputs and outputs the obtained signal as the final double-bit error notification signal.

According to such a configuration, the error notification check circuit 33 outputs 1 as the double-bit error notification signal, when one of the single-bit error notification signal of the ECC decoder circuit 31 and the single-bit error notification signal of the ECC decoder circuit 32 is 1 (that is, when it is indicated that the correctable single-bit error exists). That is, when only one of the single-bit error notification signal of the ECC decoder circuit 31 and the single-bit error notification signal of the ECC decoder circuit 32 is 1, the error notification check circuit 33 generates the notification signal indicating that the bit string (D0-D7, E0-E4, F0-F4) read from the memory 6 includes a two or more-bit error. When at least one of the double-bit error notification signal of the ECC decoder circuit 31 and the double-bit error notification signal of the ECC decoder circuit 32 is 1 (that is, when it is indicated that a two or more-bit error exists), the error notification check circuit 33 outputs 1 as the double-bit error notification signal. That is, when at least one of the double-bit error notification signal of the ECC decoder circuit 31 and the double-bit error notification signal of the ECC decoder circuit 32 is 1, the error notification check circuit 33 generates the notification signal indicating that the bit string (D0-D7, E0-E4, F0-F4) read from the memory 6 includes a two or more-bit error.

As explained above, in the present embodiment, the ECC by the ECC encoder circuit 21 and the check bit as the ECC by the ECC encoder circuit 22 are generated. They are ECCs according to different ECC generation matrices. Even if it is the occurrence pattern of an error that is missed in the detection processing using the ECC generated by the ECC encoder circuit 21, the error may be discovered in the detection processing using the check bit generated by the ECC encoder circuit 22. Therefore, it is possible to improve the detection performance, compared with the error detection of data, only based on the ECC generated by the ECC encoder circuit 21.

In Embodiment 1, the example that the 5-bit ECC and the 5-bit check bit are added to the 8-bit data is explained. However, the number of bits of the data (data as a storage object) to which the ECC (check bit) is appended and the number of bits of the ECC (check bit) may be arbitrary. For example, it is also possible to append an 8-bit ECC and an 8-bit check bit to the 64-bit data.

FIG. 20A and FIG. 20B illustrate an example of an ECC generation matrix that generates an 8-bit ECC (E0-E7) from 64-bit input data (D0-D63) to be written in the memory as the write data. Corresponding to this ECC generation matrix, an ECC check matrix that generates an 8-bit syndrome code (S0-S7) is determined from the 64-bit read data (D0-D63) and the 8-bit ECC (E0-E7), read from the memory. The left-hand-side 64 columns of this ECC check matrix have the same contents as the 64 columns of the ECC generation matrix, and the unit matrix of 8 rows by 8 columns is added to the right-hand-side 8 columns of the ECC check matrix.

As for the ECC generation matrix for generating the check bit, a matrix obtained by performing arbitrary rotations may be used, as is the case with Embodiment 1. The ECC check matrix for the check bits is determined corresponding to the ECC generation matrix for the check bits. The encoder circuit and the decoder circuit for the check bits may receive the data obtained by performing the same rotation as the ECC generation matrix. Also, when the 8-bit ECC and the 8-bit check bit are appended to the 64-bit data, it is possible to improve the detection performance of the multi-bit error. The total number of bits of the ECC and the check bit to be appended to the 64-bit data can be 16 bits. That is, the total number of bits of the ECC and the check bit can be 2 bytes that is the size suitable for data communications.

Embodiment 2

Next, Embodiment 2 is described. In Embodiment 2, the same encoder device 20 as used in Embodiment 1 is used. However, as for the decoder device, a decoder device 30A is used instead of the decoder device 30.

Figure 21:
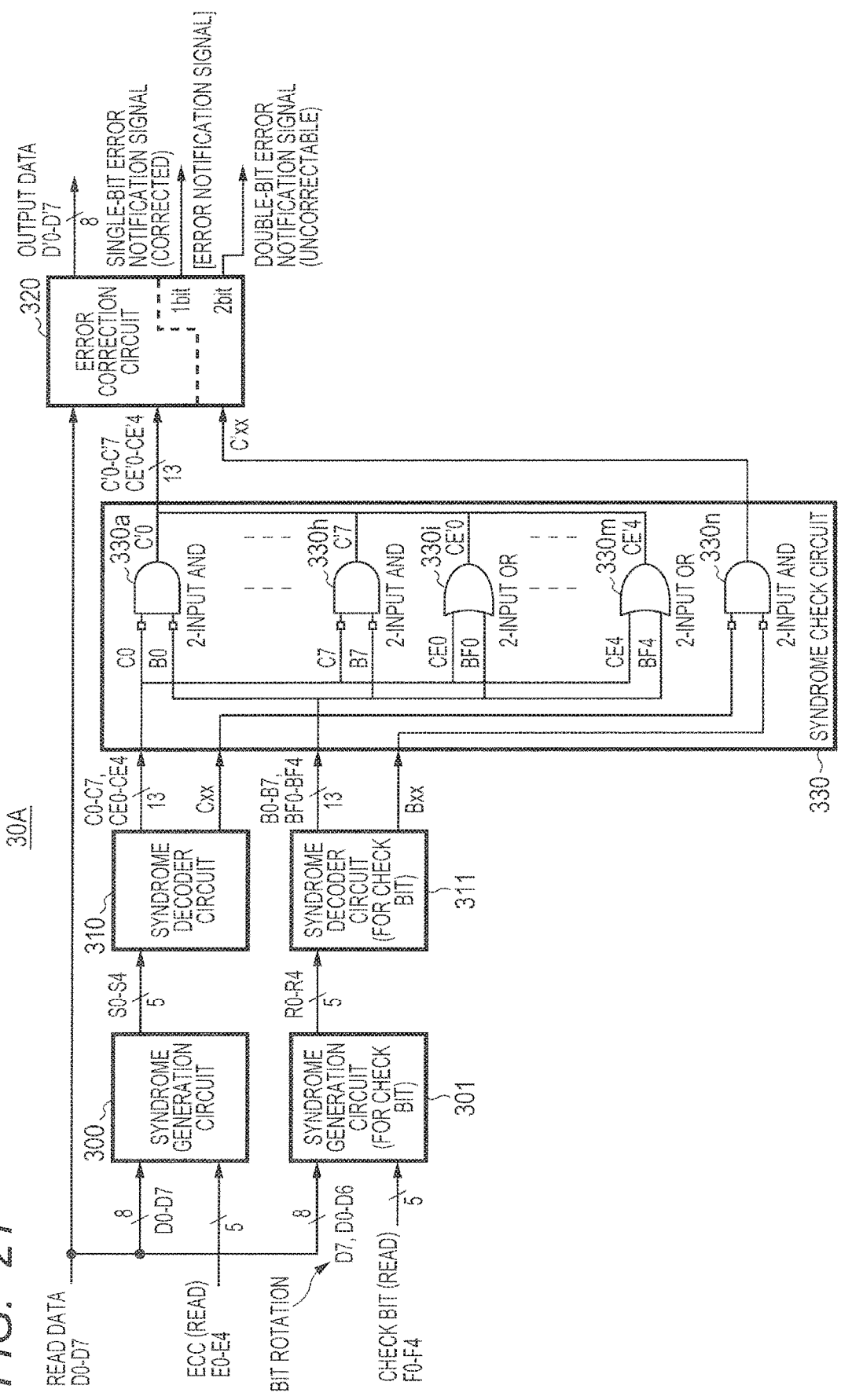
FIG. 21 is a block diagram illustrating a configuration of a decoder device 30A.

FIG. 21 is a block diagram illustrating a configuration of the decoder device 30A according to Embodiment 2. The decoder device 30A includes syndrome generation circuits 300 and 301, syndrome decoder circuits 310 and 311, a syndrome check circuit 330, and an error correction circuit 320.

The syndrome generation circuit 300 of the decoder device 30A is the same as the syndrome generation circuit 300 of the ECC decoder circuit 31 (refer to FIG. 9), and generates and outputs a 5-bit syndrome code (S0-S4) from the 8-bit read data (D0-D7) and the 5-bit ECC (E0-E4).

The syndrome generation circuit 301 of the decoder device 30A is the same as the syndrome generation circuit 301 of the ECC decoder circuit 32 (refer to FIG. 19), and generates and outputs a 5-bit syndrome code (R0-R4) from the data (D7, D0-D6) obtained by rotating the bit position of the 8-bit read data and from the 5-bit check bit (F0-F4).

The syndrome decoder circuit 310 of the decoder device 30A is the same as the syndrome decoder circuit 310 of the ECC decoder circuit 31 (refer to FIG. 9), decodes the 5-bit syndrome code (S0-S4), and generates and outputs a 13-bit error bit position flag (C0-C7, CE0-CE4) and a no error flag (Cxx).

The syndrome decoder circuit 311 of the decoder device 30A is the same as the syndrome decoder circuit 311 of the ECC decoder circuit 32 (refer to FIG. 19), decodes the 5-bit syndrome code (R0-R4), and generates and outputs a 13-bit error bit position flag (B0-B7, BF0-BF4) and a no error flag (Bxx).

The syndrome generation circuit 300 and the syndrome decoder circuit 310 of the decoder device 30A is also called the first syndrome unit. The first syndrome unit generates the first syndrome code (S0-S4) from the read data (D0-D7) and the ECC (E0-E4), read from the memory 6. The first syndrome unit generates the first flag (C0-C7, CE0-CE4) and the second flag (Cxx). The first flag (C0-C7, CE0-CE4) indicates whether the first syndrome code matches with a bit pattern of any one of the columns of the ECC check matrix (the first ECC check matrix) composed of the ECC generation matrix (the first ECC generation matrix) for generating the ECC (E0-E4) and the unit matrix, The second flag (Cxx) indicates whether all the bits of the first syndrome code are 0.

The syndrome generation circuit 301 and the syndrome decoder circuit 311 of the decoder device 30A is also called the second syndrome unit. The second syndrome unit generates the second syndrome code (R0-R4) from the data (D7, D0-D6) obtained by permutating the bits of the read data (D0-D7) read from the memory 6 and from the check bit (F0-F4) read from the memory 6. The second syndrome unit generates the third flag (B0-B7, BF0-BF4) and the fourth flag (Bxx). The third flag (B0-B7, BF0-BF4) indicates whether the second syndrome code matches with the bit pattern of any one of the columns of the ECC check matrix (the second ECC check matrix) composed of the ECC generation matrix (the second ECC generation matrix) for generating the check bit (F0-F4) and the unit matrix. The fourth flag (Bxx) indicates whether all the bits of the second syndrome code are 0.

The syndrome check circuit 330 is also called the syndrome check unit, and compares the first flag (C0-C7, CE0-CE4) with the third flag (B0-B7, BF0-BF4), and compares the second flag (Cxx) with the fourth flag (Bxx). That is, the syndrome check circuit 330 checks the matching of two kinds of the error bit position flags (C0-C7 and B0-B7), generates the error bit position flag (C'0-C'7) of which the accuracy (reliability) is improved, and outputs the result of the OR operations performed on the error bit position flag (CE0-CE4) and the error bit position flag (BF0-BF4), as the error bit position flag (CE'0-CE'4). Similarly, the syndrome check circuit 330 checks the matching of two kinds of no error flags (Cxx and Bxx), and generates the no error flag (C'xx) with the improved accuracy (reliability).

The syndrome check circuit 330 is configured with AND circuits 330a-330h, OR circuits 330i-330m, and an AND circuit 330n, as illustrated in FIG. 21. The AND circuits 330a-330h are 2-input AND circuits. The OR circuits 330i-330m are 2-input OR circuits. The AND circuits 330a-330h receive the error bit position flag (C0-C7) outputted from the syndrome decoder circuit 310 and the error bit position flag (B0-B7) outputted from the syndrome decoder circuit 311. When both the inputted values are 1, the AND circuits 330a-330h output 1, otherwise output 0. That is, when explained with reference to the first flag (C0-C7), the third flag (B0-B7), the first syndrome code (S0-S4), the second syndrome code (R0-R4), the first ECC check matrix, and the second ECC check matrix, the syndrome check circuit 330 outputs the flag (C'0-C'7) as follows. Only when both of the first conditions and the second conditions are satisfied, the syndrome check circuit 330 outputs the fifth flag (C'0-C'7) indicating that the first syndrome code (S0-S4) matches with the bit pattern of the t-th column of the first ECC check matrix (here, t is a positive integer and is the column number corresponding to any one of the columns of the first ECC generation matrix included in the first ECC check matrix). Here, the first conditions are that the first flag (C0-C7) indicates that the first syndrome code (S0-S4) matches with the bit pattern of the t-th column of the first ECC check matrix. The second conditions are that the third flag (B0-B7) indicates that the second syndrome code (R0-R4) matches with the bit pattern of the t-th column of the second ECC check matrix.

The OR circuits 330i-330m receive the error bit position flag (CE0-CE4) outputted from the syndrome decoder circuit 310 and the error bit position flag (BF0-BF4) outputted from the syndrome decoder circuit 311. When at least one of the inputted values is 1, the OR circuits 330i-330m output 1, otherwise output 0. That is, when explained with reference to the first flag (CE0-CE4), the third flag (BF0-BF4), the first syndrome code (S0-S4), the second syndrome code (R0-R4), the first ECC check matrix, and the second ECC check matrix, the syndrome check circuit 330 outputs the flag (CE'0-CE'4) as follows. The syndrome check circuit 330 outputs the fifth flag (CE'0-CE'4) indicating that the first syndrome code (S0-S4) matches with the bit pattern of the s-th column of the first ECC check matrix, when the first flag (CE0-CE4) indicates that the first syndrome code (S0-S4) matches with the bit pattern of the s-th column of the first ECC check matrix (here, s is a positive integer and is the column number corresponding to any one of the columns of the unit matrix included in the first ECC check matrix), or when the third flag (BF0-BF4) indicates that the second syndrome code (R0-R4) matches with the bit pattern of the s-th column of the second ECC check matrix.

The AND circuit 330n receives the no error flag (Cxx) outputted from the syndrome decoder circuit 310 and the no error flag (Bxx) outputted from the syndrome decoder circuit 311. When both the inputted values are 1, the AND circuit 330n outputs 1, otherwise outputs 0. That is, when explained with reference to the second flag (Cxx), the fourth flag (Bxx), the first syndrome code (S0-S4), and the second syndrome code (R0-R4), the syndrome check circuit 330 outputs the flag (C'xx) as follows. The syndrome check circuit 330 outputs the sixth flag (C'xx) indicating that all the bits of the first syndrome code is 0, only when the second flag indicates that all the bits of the first syndrome code are 0 and the fourth flag indicates that all the bits of the second syndrome code are 0.

The error bit position flag (C'0-C'7, CE'0-CE'4) and the no error flag (C'xx) that are outputted from the syndrome check circuit 330 are inputted into the error correction circuit 320. The error correction circuit 320 of the decoder device 30A is the same as the error correction circuit 320 of the ECC decoder circuit 31 (refer to FIG. 9), and performs the error correction and the error notification using the error bit position flag (C' 0-C' 7, CE' 0-CE' 4) and the no error flag (C'xx) that are outputted from the syndrome check circuit 330. When any one of the flags of the error bit position flag (C'0-C'7) is 1, the error correction circuit 320 performs the single-bit error correction by reversing the value of a bit at the bit position (any one of bits of D0-D7) corresponding to the read data (D0-D7) and outputs the output data (D' 0-D' 7) after the single-bit error correction. The error correction circuit 320 generates the error notification signal composed of the single-bit error notification signal and the double-bit error notification signal, based on the error bit position flag (C'0-C' 7, CE'0-CE' 4) and the no error flag (C'xx). In this way, the configuration and operations of the error correction circuit 320 of the decoder device 30A are the same as those of the error correction circuit 320 illustrated in FIG. 9, except that the error bit position flag (C' 0-C' 7, CE' 0-CE' 4) and the no error flag (C'xx) outputted by the syndrome check circuit 330 are used, instead of the error bit position flag (C0-C7, CE0-CE4) and the no error flag (Cxx) outputted by the syndrome decoder circuit 310.

In this way, in the present embodiment, the decoder device 30A performs the single-bit error correction and the error notification based on the comparison result of the syndrome check circuit 330. That is, the decoder device 30A performs the single-bit error correction to the read data (D0-D7) read from the memory 6, based on the value of the error bit position flag (C'0-C' 7) of which the accuracy is improved by the syndrome check circuit 330. The decoder device 30A performs the error notification, based on the value of the error bit position flag (C'0-C'7, CE'0-CE'4) and the value of the no error flag (C'xx) of which the accuracy is improved by the syndrome check circuit 330. This error notification is made by unifying the error detection result by the ECC and the error detection result by the check bit. Therefore, it is possible to improve the detection performance of errors also in the present embodiment.

As described above, the syndrome check circuit 330 checks the error bit position flag (C0-C7) and the error bit position flag (B0-B7) by using the AND circuits 330a-330h. Therefore, when the value of the error bit position flag C0 differs from the value of the error bit position flag B0 for example, the value of C'0 is set to 0. In this case, the value of a bit at the bit position corresponding to C0 is not corrected in the error correction circuit 320. That is, in the present embodiment, the correction processing is performed only when the value of the error bit position flag (C0-C7) matches with the value of the error bit position flag (B0-B7). That is, according to the present embodiment, it is possible to avoid an erroneous correction. The syndrome check circuit 330 checks the no error flag (Cxx) and the no error flag (Bxx) by using the AND circuit 330n. Therefore, when the value of the no error flag Cxx differs from the value of the no error flag Bxx, the value of C'xx is set to 0. That is, in this case, 1 indicative of no error is not outputted as the output of C'xx. Accordingly, it is possible to avoid missing of the error detection.

FIG. 22 is a table summarizing error detection misses occurring in the algorithm of the error detection according to Embodiment 2. FIG. 23 is a table summarizing the number of the cases of erroneous correction occurring in the algorithm of the error detection according to Embodiment 2. Interpretation of these tables is the same as that of FIG. 10 and FIG. 11. However, in Embodiment 2, the 8-bit write data (D0-D7), the 5-bit ECC (E0-E4), and the 5-bit check bit (F0-F4) are stored in the memory 6. Accordingly, FIG. 22 and FIG. 23 show the result for from k=1 to k=18.

As seen from FIG. 10 and FIG. 22, the total number of the detection miss of errors are same; however, in the comparative example, the detection miss of 55 errors occurs in k=4; on the contrary, it becomes zero in Embodiment 2. In the comparative example, the detection miss of 96 errors in total occurs in k=5 and k=6; on the contrary, it becomes 28 in Embodiment 2. In this way, in Embodiment 2, it is possible to decrease the miss number when k is comparatively small. As shown in FIG. 11 and FIG. 23, in connection with this, the number of erroneous corrections also decreases when k is comparatively small.

Embodiment 3

Next, Embodiment 3 is explained. Embodiment 3 differs from Embodiment 1 in that the number of bits of the check bit is reduced by using a part of bits of the ECC also as the check bit. Specifically, in Embodiment 1, the 5-bit check bit is used in comparison with the 5-bit ECC. However, in Embodiment 3, a 3-bit check bit is used. The input/output interface 10 according to Embodiment 3 includes an encoder device 20A instead of the encoder device 20, and includes a decoder device 30B instead of the decoder device 30.

Figures 24, 25:
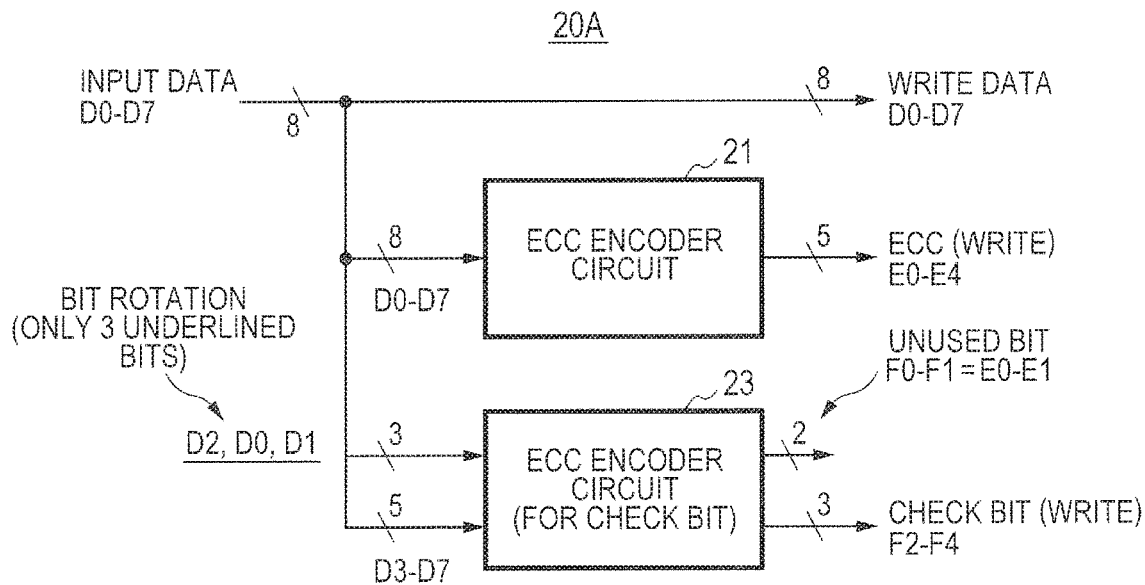
FIG. 24 is a block diagram illustrating an encoder device 20A.
FIG. 25 is a drawing illustrating an example of an ECC generation matrix used for an ECC encoder circuit 23.

FIG. 24 is a block diagram illustrating the encoder device 20A. As illustrated in FIG. 24, the encoder device 20A includes an ECC encoder circuit 21 and an ECC encoder circuit 23. The ECC encoder circuit 21 of the encoder device 20A is the same as the ECC encoder circuit 21 of the encoder device 20, and generates an ECC capable of the single error correction and double error detection, by performing operations according to the first ECC generation matrix. The ECC encoder circuit 23 generates the ECC capable of the single error correction and double error detection as the check bit, by performing operations according to the second ECC generation matrix obtained by permutating multiple columns having the same value of the predetermined row in the first ECC generation matrix. The ECC encoder circuit 21 and the ECC encoder circuit 23 have the same circuit configuration. However, the ECC encoder circuit 21 and the ECC encoder circuit 23 generate different ECCs since the bit order of the inputted data is different.

FIG. 25 illustrates an example of an ECC generation matrix used for the ECC encoder circuit 23. As illustrated in FIG. 25, this ECC generation matrix generates a 5-bit check bit (F0-F4) from the 8-bit input data (D0-D7), and has an arrangement that each column of a part of the ECC generation matrix illustrated in FIG. 3 used by the ECC encoder circuit 21 (three columns (portions of D0-D2) on the left-hand side of the lower three rows (portions of F2-F4)) is rotated to the left by one column. In the ECC generation matrix illustrated in FIG. 3, three columns on the left-hand side (portions of D0-D2) have the same element value in the first row and the same element value in the second row. Therefore, the ECC generation matrix illustrated in FIG. 25 is a matrix obtained by permutating three columns (three columns on the left-hand side) of which the first row and the second row have the same value, in the ECC generation matrix illustrated in FIG. 3. In the ECC generation matrix to which such permutation has been performed, the values of the first row and the second row do not change in any column, before and after the permutation. That is, the ECC (E0) generated for the first row of the ECC generation matrix before the permutation is the same as the check bit (F0) generated for the first row of the ECC generation matrix after the permutation. Similarly, the ECC (E1) generated for the second row of the ECC generation matrix before the permutation is the same as the check bit (F1) generated for the second row of the ECC generation matrix after the permutation. Therefore, it is not necessary to store, in the memory 6, the check bit (F0, F1) generated in the ECC encoder circuit 23.

The ECC encoder circuit 23 receives data of which the bit permutation has been performed. This permutation corresponds to the permutation for deriving the ECC generation matrix illustrated in FIG. 25. That is, the ECC encoder circuit 23 receives the data of which the permutation has been performed to rotate only D0-D2. Specifically, as illustrated in FIG. 24, the ECC encoder circuit 23 receives the data (D2, D0, D1, D3-D7) obtained by rotating only the bit position of the lower-order three bits of the 8-bit input data, and the ECC encoder circuit 23 generates the 5-bit check bit (F0-F4).

The encoder device 20A writes the input data into the memory 6 as the 8-bit write data (D0-D7) together with the generated 5-bit ECC (E0-E5) and the higher order 3 bits (F2-F4) of the generated 5-bit check bit. As described above, lower-order 2 bits (F0-F1) of the 5-bit check bit generated by the ECC encoder circuit 23 become the completely same as the lower-order 2 bits (E0-E1) of the 5-bit ECC generated by the ECC encoder circuit 21. Accordingly, it is not necessary to duplicate writing into the memory 6. In this way, the encoder device 20A stores into the memory 6 the input data, all the bits of the ECC generated by the ECC encoder circuit 21, and a part of bits of the ECC generated by the ECC encoder circuit 23. The part of the bits concerned are bits obtained by the operations using rows other than the predetermined rows described above in the ECC generation matrix used by the ECC encoder circuit 23.

Figure 26:
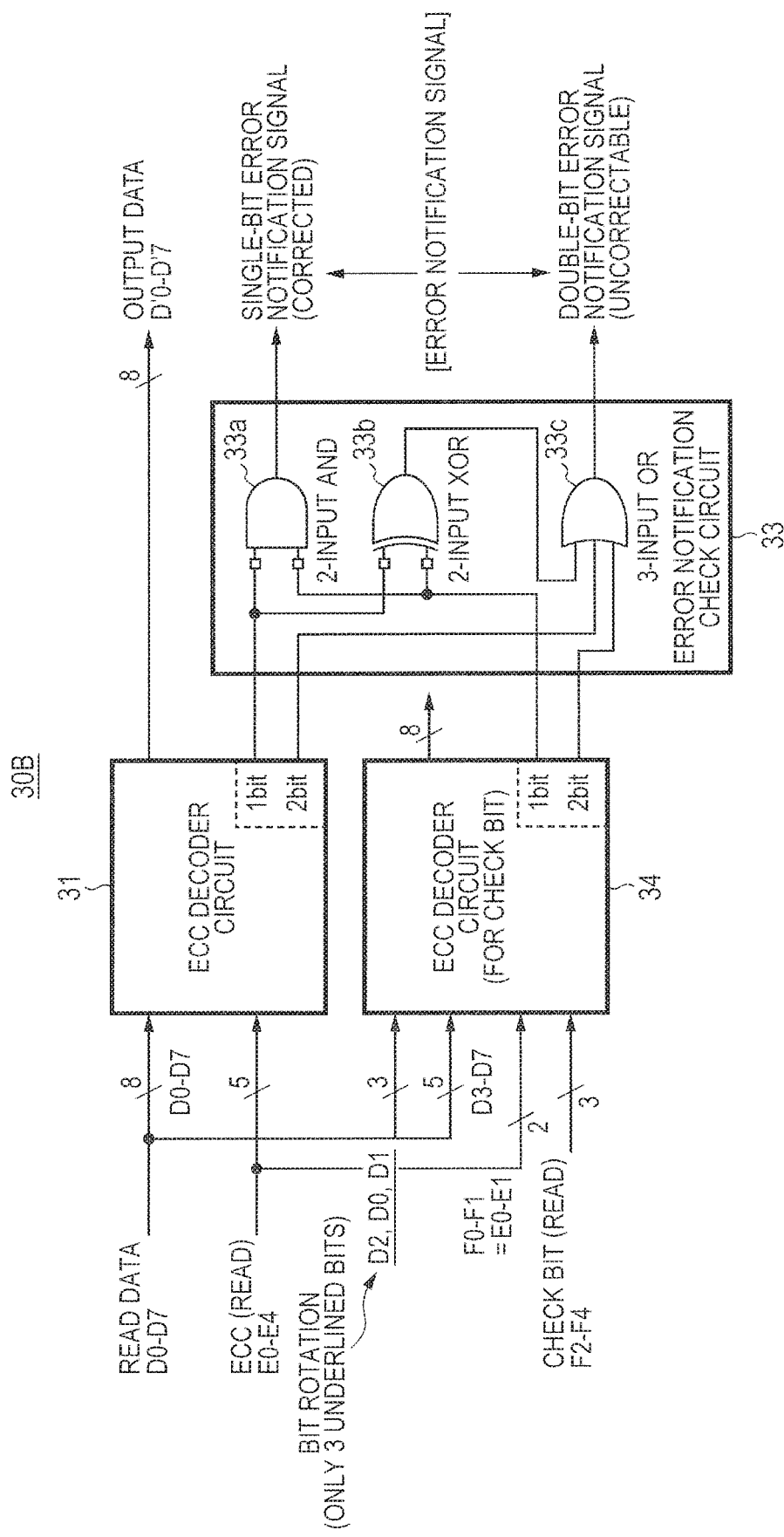
FIG. 26 is a block diagram illustrating a decoder device 30B.

Next, the decoder device 30B is explained. FIG. 26 is a block diagram illustrating the decoder device 30B. The decoder device 30B includes an ECC decoder circuit 31, an ECC decoder circuit 34, and an error notification check circuit 33.

The ECC decoder circuit 31 of the decoder device 30B is the same as the ECC decoder circuit 31 of the decoder device 30, performs the single error correction and double error detection to the 8-bit read data (D0-D7) and the 5-bit ECC (E0-E4), read from the memory 6, and corrects the error of a bit of which a single-bit error is detected. The ECC decoder circuit 34 performs the single error correction and double error detection, reading from the memory 6 and using the data (D2, D0, D1, D3-D7) obtained by rotating only of the bit position of the lower-order 3 bits of the 8-bit read data, the lower-order 2 bits (E0=F0, E1=F1) of the 5-bit ECC, and the higher order 3 bits (F2-F4) of the 5-bit check bit. The ECC decoder circuit 31 and the ECC decoder circuit 34 have the same circuit configuration; however, they have different decoding objects, since the bit order of the data inputted is different.

FIG. 27 illustrates an ECC check matrix used for the ECC decoder circuit 31 of the decoder device 30B. The ECC check matrix used for the ECC decoder circuit 31 of the decoder device 30B is a matrix for generating the 5-bit syndrome code (S0-S4) from the 8-bit read data (D0-D7) and the 5-bit ECC (E0-E4). The ECC check matrix illustrated in FIG. 27 includes the columns (drawn with oblique lines) corresponding to the higher order 3 bits (F2-F4) of the 5-bit check bit of which the element is filled with 0 because it is not used for operations. 13 columns on the left-hand side not drawn with oblique lines have the same contents as the ECC check matrix illustrated in FIG. 7.

FIG. 28 illustrates an ECC check matrix used for the ECC decoder circuit 34 of the decoder device 30B. The ECC check matrix used for the ECC decoder circuit 34 of the decoder device 30B is a matrix for generating a 5-bit syndrome code (R0-R4), from the 8-bit read data (D0-D7), lower-order 2 bits (E0=F0, E1=F1) of the 5-bit ECC, and higher order 3 bits (F2-F4) of the 5-bit check bit. The ECC check matrix illustrated in FIG. 28 includes the columns (drawn with oblique lines) corresponding to the higher order 3 bits (E2-E4) of the 5-bit ECC of which the element is filled with 0 because it is not used for operations. Eight columns on the left-hand side (columns corresponding to D0-D7) have an arrangement obtained by rotating some columns (columns corresponding to D0-D2) of eight columns (columns corresponding to D0-D7) on the left-hand side of the ECC check matrix illustrated in FIG. 27. Here, all of the upper 2 rows are 1; accordingly, when described in detail, eight columns on the left-hand side of FIG. 28 (columns corresponding to D0-D7) have an arrangement obtained by rotating each column of a part of eight columns (columns corresponding to D0-D7) on the left-hand side of the ECC check matrix illustrated in FIG. 27 (3 columns (columns corresponding to D0-D2) on the left-hand side of the lower 3 rows (rows corresponding to R2-R4)), to the left by one column.

The error notification check circuit 33 of the decoder device 30B is the same as the error notification check circuit 33 of the decoder device 30, and generates a final error notification signal, based on the error notification outputted by the ECC decoder circuit 31 and the error notification outputted by the ECC decoder circuit 34.

In this way, the decoder device 30B generates the notification signal based on the read data (D0-D7), the ECC (E0-E4), and a part of bits (F2-F4) of the check bit, read from the memory 6.

In the above, Embodiment 3 is explained. As is the case with Embodiment 1, in the present Embodiment, the error detection by the ECC and the error detection by the check bit are performed. Therefore, it is possible to improve the detection performance, compared with the error detection of the data based on only one kind of ECC. As described in the above, the lower-order 2 bits of the ECC can be shared with the lower-order 2 bits of the check bit. Therefore, the total number of bits of the data, the ECC, and the check bit can be set as 16 bits. That is, the total number of bits can be set as 2 bytes that is the size suitable for data communications.

Figure 29:
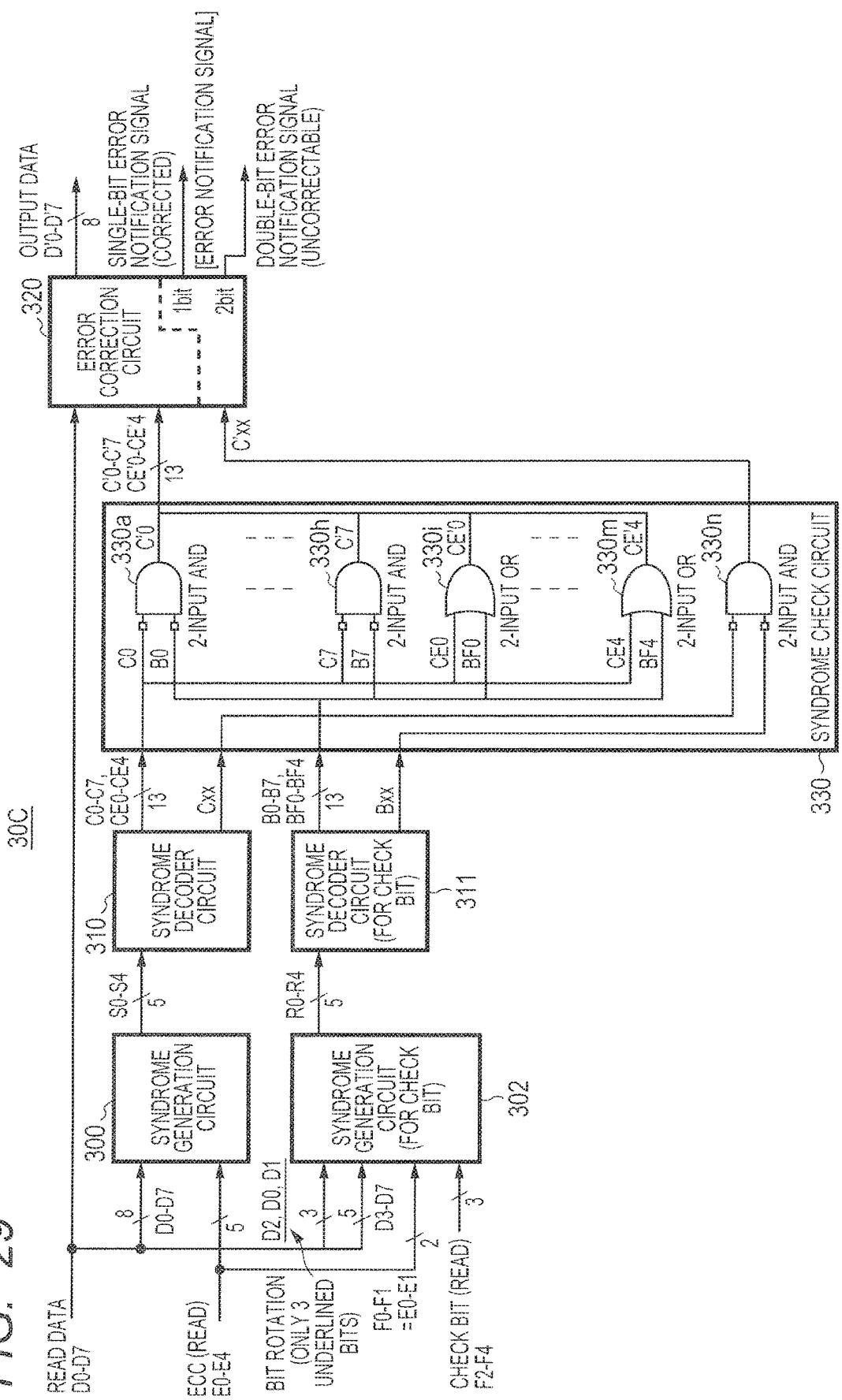
FIG. 29 is a block diagram illustrating a decoder device 30C.

Hereinafter, a Modified Example of Embodiment 3 is explained. In Embodiment 2, it is also preferable to share the bits of the ECC and the check bit as in Embodiment 3. That is, the encoder device 20A according to Embodiment 3 and the decoder device 30C illustrated in FIG. 29 may be used. The decoder device 30C illustrated in FIG. 29 is the same as the decoder device 30A according to Embodiment 2 illustrated in FIG. 21 except that the syndrome generation circuit 301 is replaced with the syndrome generation circuit 302. The syndrome generation circuit 302 has the same circuit configuration as the syndrome generation circuit 301. However, the bit order of the data inputted is different; accordingly, the syndrome codes to be generated is different.

As is the case with the ECC decoder circuit 34 described above, the syndrome generation circuit 302 receives the data (D2, D0, D1, D3-D7) obtained by rotating the bit position of only the lower-order 3 bits of the 8-bit read data, the lower-order 2 bits (E0=F0, E1=F1) of the 5-bit ECC, and the higher order 3 bits (F2-F4) of the 5-bit check bit, read from the memory 6. The syndrome code is generated based on these inputs.

By adopting such a configuration, also in Embodiment 2, the total number of bits can be set as 2 bytes that is the size suitable for data communications.

FIG. 30 is a table summarizing error detection misses occurring in the algorithm of the error detection according to the Modified Example of Embodiment 3. FIG. 31 is a table summarizing the number of the cases of erroneous correction occurring in the algorithm of the error detection according to the Modified Example of Embodiment 3. Interpretation of these tables is the same as that of FIG. 10 and FIG. 11. However, in the Modified Example of Embodiment 3, the 8-bit write data (D0-D7), the 5-bit ECC (E0-E4), and the 3-bit check bit (F2-F4) are stored in the memory 6. Accordingly, FIG. 30 and FIG. 31 illustrate the results of from k=1 to k=16.

As seen from FIG. 10 and FIG. 30, although the total of the detection miss of errors does not change, in the comparative example, 55 detection misses of errors occur in k=4; however, in the Modified Example of Embodiment 3, the detection misses of errors become four. In the comparative example, 96 detection misses of errors in total occur in k=5 and k=6. However, in the Modified Example of Embodiment 3, the number of the detection misses becomes 59. In this way, in the Modified Example of Embodiment 3, it is possible to decrease the miss number when the value of k is comparatively small. In connection with this, the number of the erroneous correction also decreases when the value of k is comparatively small, as seen from FIG. 11 and FIG. 31.

Embodiment 4

Next, Embodiment 4 is described. In Embodiment 1 to Embodiment 3, the encoder device includes two ECC encoder circuits with the same circuit configuration, and one of the ECC encoder circuits is used as the circuit to generate the check bit. As opposed to this, an encoder device 20B according to Embodiment 4 includes an ECC encoder circuit 21 and a check bit generation circuit 24 that have mutually different circuit configurations.

An input/output interface 10 according to Embodiment 4 includes an encoder device 20B instead of the encoder device 20, and a decoder device 30D instead of the decoder device 30.

Figure 32:
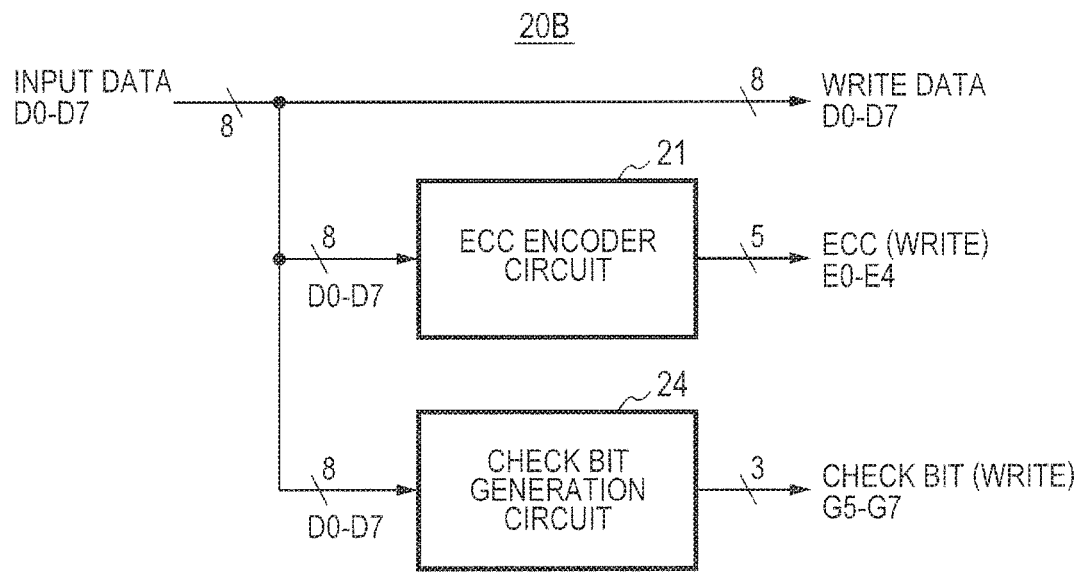
FIG. 32 is a block diagram illustrating an encoder device 20B.

FIG. 32 is a block diagram illustrating the encoder device 20B. As illustrated in FIG. 32, the encoder device 20B includes the ECC encoder circuit 21 and the check bit generation circuit 24. The ECC encoder circuit 21 of the encoder device 20B is the same as the ECC encoder circuit 21 according to Embodiment 1 for example, and generates an ECC capable of the single error correction and double error detection, by performing operations according to a predetermined ECC generation matrix. In Embodiment 4, the ECC generation matrix used by the ECC encoder circuit 21 is called an ECC generation submatrix. The check bit generation circuit 24 generates a check bit by performing operations according to a predetermined check bit generation matrix.

Here, the ECC generation submatrix used by the ECC encoder circuit 21 and the check bit generation matrix used by the check bit generation circuit 24 are explained. The ECC generation submatrix and the check bit generation matrix are a submatrix of the predetermined ECC generation matrix (hereinafter called an ECC generation full-matrix). Here, it is assumed that the ECC generation full-matrix is an ECC generation matrix for generating a p-bit ECC (p is a positive integer) that is capable of the single error correction and double error detection. In this case, the check bit generation matrix is a submatrix of q rows of the ECC generation full-matrix (q is a positive integer less than p), and the ECC generation submatrix is a r-row submatrix (r=p-q) of the ECC generation full-matrix from which the q-row submatrix is removed. The ECC encoder circuit 21 generates the r-bit ECC capable of the single error correction and double error detection by performing operations according to such an ECC generation submatrix. The check bit generation circuit 24 generates the q-bit check bit by performing operations according to the check bit generation matrix. A concrete example of Embodiment 4 assumes that p=8, q=3, and r=5.

Figure 33:
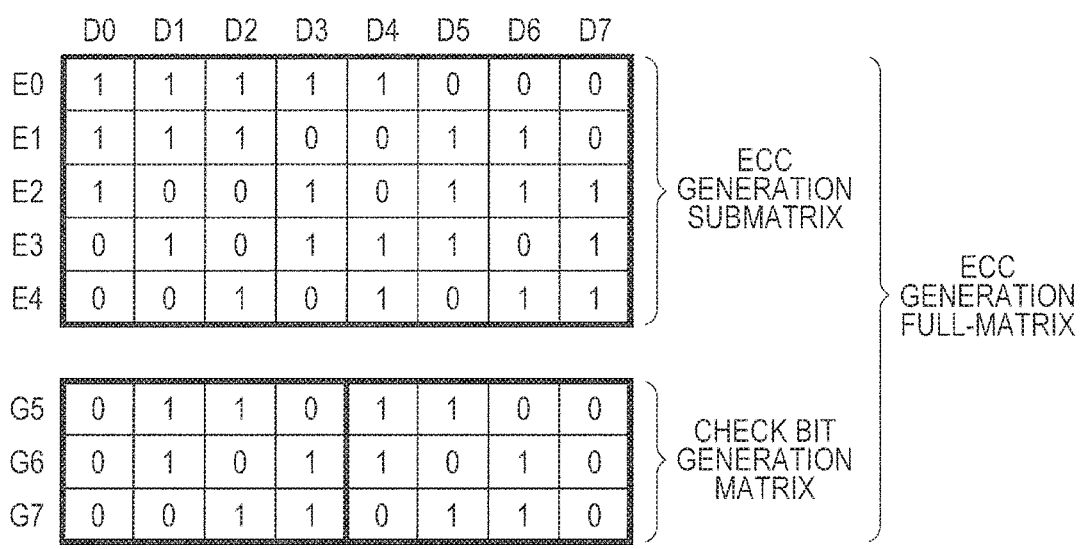
FIG. 33 illustrates an example of an ECC generation full-matrix, an ECC generation submatrix, and a check bit generation matrix.

FIG. 33 illustrates an example of the ECC generation full-matrix, the ECC generation submatrix, and the check bit generation matrix. In FIG. 33, the 5-row by 8-column matrix illustrated in the upper part is the ECC generation submatrix, the 3-row by 8-column matrix illustrated in the lower part is the check bit generation matrix, and the whole 8-row by 8-column matrix is the ECC generation full-matrix. The ECC generation full-matrix illustrated in FIG. 33 is an ECC generation matrix that can generate the 8-bit ECC capable of the single error correction and double error detection from the 8-bit input data (D0-D7). The ECC generation submatrix illustrated in FIG. 33 is an ECC generation matrix that can generate the 5-bit ECC (E0-E4) capable of the single error correction and double error detection from the 8-bit input data (D0-D7). The check bit generation matrix illustrated in FIG. 33 is a matrix that can generate the 3-bit check bit (G5-G7) from the 8-bit input data (D0-D7). It should be noted that, in the check bit generation matrix illustrated in FIG. 33, the bit patterns for each column are not eight kinds but only four kinds. Accordingly, the check bit is not the SEC-DED code.

The 8-bit data (D0-D7) is inputted into the ECC encoder circuit 21 of the encoder device 20B. The ECC encoder circuit performs operations using the ECC generation submatrix illustrated in the upper part of FIG. 33 and generates the 5-bit ECC (E0-E4) corresponding to the 8-bit input data (D0-D7). An example of the concrete circuit configuration of the ECC encoder circuit 21 of the encoder device 20B is as illustrated in FIG. 5.

Figure 34:
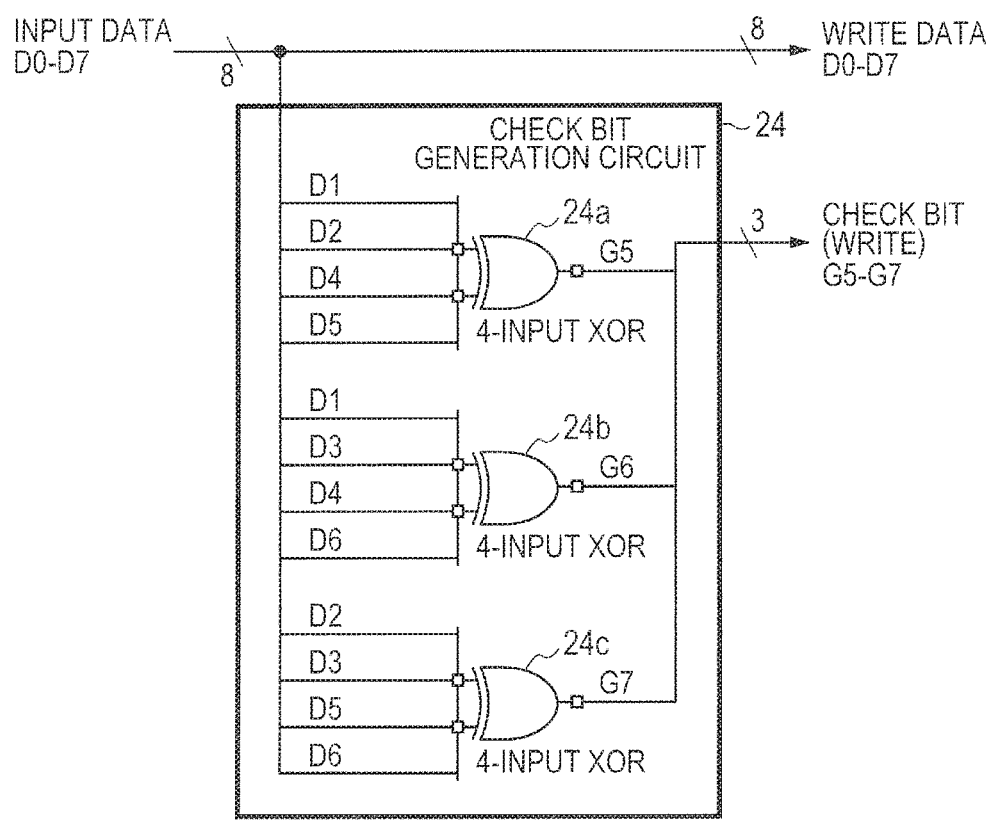
FIG. 34 is a block diagram illustrating an example of a concrete circuit configuration of a check bit generation circuit 24.

The 8-bit data (D0-D7) is inputted into the check bit generation circuit 24 of the encoder device 20B. The check bit generation circuit 24 performs operations using the check bit generation matrix illustrated in the lower part of FIG. 33 and generates the 3-bit check bit (G5-G7) corresponding to the 8-bit input data (D0-D7). FIG. 34 is a block diagram illustrating an example of the concrete circuit configuration of the check bit generation circuit 24. The check bit generation circuit 24 generates the 3-bit check bit (G5-G7) from the 8-bit input data (D0-D7) by performing the XOR operations according to the check bit generation matrix illustrated in FIG. 33. The check bit generation circuit 24 is configured with three XOR circuits 24a-24c. The XOR circuits 24a-24c are 4-input XOR circuits. Each of the XOR circuits 24a-24c performs operations according to the check bit generation matrix illustrated in FIG. 33 and determines the value of one bit of the 3-bit check bits (G5-G7).

G5 is obtained as an output of the XOR circuit 24a. Specifically, the XOR circuit 24a performs the XOR operations on D1, D2, D4, and D5 and outputs an operation result as G5. Similarly, G6 is obtained as an output of the XOR circuit 24b. G7 is obtained as an output of the XOR circuit 24c.

The encoder device 20B stores the input data as the 8-bit write data (D0-D7) into the memory 6, together with the generated 5-bit ECC (E0-E4) and the generated 3-bit check bit (G5-G7).

Figure 35:
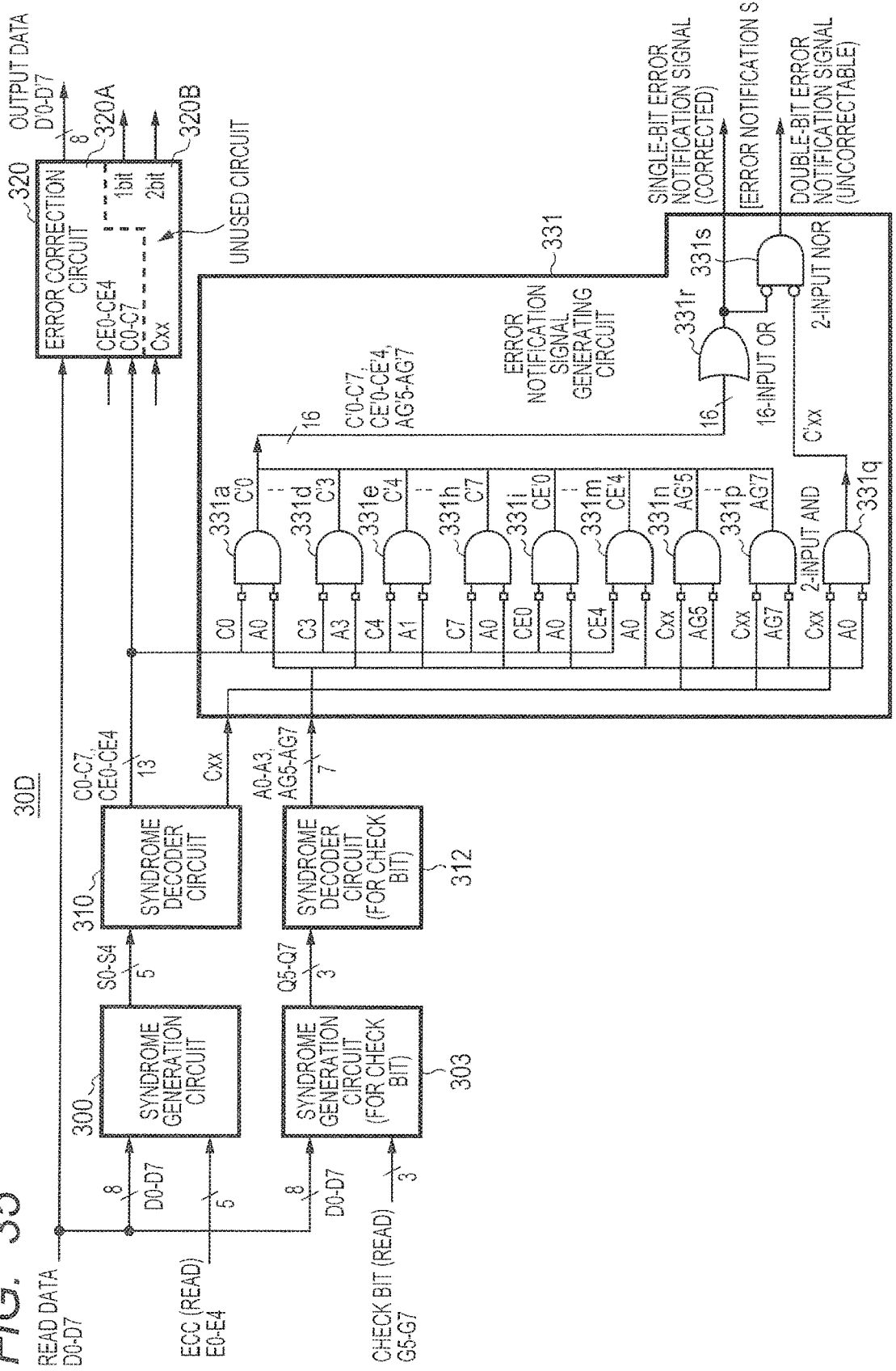
FIG. 35 is a block diagram illustrating a configuration of a decoder device 30D.

Next, the decoder device 30D is explained. FIG. 35 is a block diagram illustrating a configuration of the decoder device 30D according to Embodiment 4. The decoder device 30D includes syndrome generation circuits 300 and 303, syndrome decoder circuits 310 and 312, an error notification signal generating circuit 331, and an error correction circuit 320.

The syndrome generation circuit 300 of the decoder device 30D is the same as the syndrome generation circuit 300 of the ECC decoder circuit 31 (refer to FIG. 9) and generates and outputs a 5-bit syndrome code (S0-S4) from the 8-bit read data (D0-D7) and the 5-bit ECC (E0-E4). The syndrome generation circuit 300 outputs the generated syndrome code to the syndrome decoder circuit 310.

The syndrome decoder circuit 310 of the decoder device 30D is the same as the syndrome decoder circuit 310 of the ECC decoder circuit 31 (refer to FIG. 9) and decodes the 5-bit syndrome code (S0-S4), to generate and to output a 13-bit error bit position flag (C0-C7, CE0-CE4) and a no error flag (Cxx). The error bit position flag (C0-C7) outputted from the syndrome decoder circuit 310 of the decoder device 30D is inputted into the error correction circuit 320. However, the error bit position flag (CE0-CE4) and the no error flag (Cxx) outputted from the syndrome decoder circuit 310 are inputted into the error notification signal generating circuit 331 not into the error correction circuit 320. The error bit position flag (C0-C7) outputted from the syndrome decoder circuit 310 of the decoder device 30D is inputted also into the error notification signal generating circuit 331.

The syndrome generation circuit 303 of the decoder device 30D generates and outputs a 3-bit syndrome code (Q5-Q7) from the 8-bit read data (D0-D7) and the 3-bit check bit (G5-G7). The syndrome generation circuit 303 outputs the generated syndrome code to the syndrome decoder circuit 312.

The syndrome decoder circuit 312 of the decoder device 30D decodes the 3-bit syndrome code (Q5-Q7) and generates and outputs a t-bit error bit position specifying auxiliary flag (A0-A3, AG5-AG7). The syndrome decoder circuit 312 outputs the generated error bit position specifying auxiliary flag to the error notification signal generating circuit 331.

The error correction circuit 320 of the decoder device 30D is the same as the error correction circuit 320 of the ECC decoder circuit 31 (refer to FIG. 9). In Embodiment 4, the error correction circuit 320 uses only the error correction function and does not use the error notification function. Therefore, the bit position flag (C0-C7) is inputted into the error correction circuit 320 as described above; however, the no error flag (Cxx) is not inputted. In this way, in Embodiment 4, only the correcting unit 320A of the error correction circuit 320 is used, and the notification processing unit 320B is not used. Therefore, in Embodiment 4, a circuit including only the correcting unit 320A may be used instead of the error correction circuit 320.

The error notification signal generating circuit 331 of the decoder device 30D generates and outputs the error notification signal composed of the single-bit error notification signal and the double-bit error notification signal, from the 13-bit bit position flag (C0-C7, CE0-CE4), the 1-bit no error flag (Cxx), and the 7-bit error bit position specifying auxiliary flag (A0-A3, AG5-AG7). The concrete circuit configuration of the error notification signal generating circuit 331 will be described later.

The syndrome generation circuits 300 and 303 generate the syndrome code by performing operations according to the check matrix illustrated in FIG. 36. In the following explanation, the check matrix used in the syndrome generation circuit 300 is called an ECC check submatrix, and the check matrix used in the syndrome generation circuit 303 is called a check-bit check matrix. The ECC check submatrix and the check-bit check matrix are a submatrix of a predetermined ECC check matrix (hereinafter called an ECC check full-matrix). Here, the ECC check full-matrix is a matrix obtained by combining the ECC generation full-matrix with the unit matrix. The ECC check submatrix is a r-row submatrix of the ECC check full-matrix (in the example illustrated in FIG. 36, r=5), and the check-bit check matrix is a q-row submatrix of the ECC check full-matrix from which the r-row submatrix is removed (in the example illustrated in FIG. 36, q=3). The syndrome generation circuit 300 generates the r-bit syndrome code by performing operations according to the ECC check submatrix. The syndrome generation circuit 303 generates the q-bit syndrome code by performing operations according to the check-bit check matrix.

The 8-row by 16-column matrix illustrated in FIG. 36 is the ECC check full-matrix, the 5-row by 16-column matrix in the upper part is the ECC check submatrix used in the syndrome generation circuit 300, and the 3-row by 16-column matrix is the check-bit check matrix used in the syndrome generation circuit 303.

The ECC check submatrix illustrated in FIG. 36 is a matrix that generates the 5-bit syndrome code (S0-S4) from the 8-bit read data (D0-D7) and the 5-bit ECC (E0-E4). The ECC check submatrix illustrated in FIG. 36 includes the columns (drawn with oblique lines) corresponding to the check bit (G5-G7) of which the element is filled with 0 because it is not used for operations. 13 columns on the left-hand side that are not drawn with oblique lines have the same contents as the ECC check matrix illustrated in FIG. 7.

Figure 37:
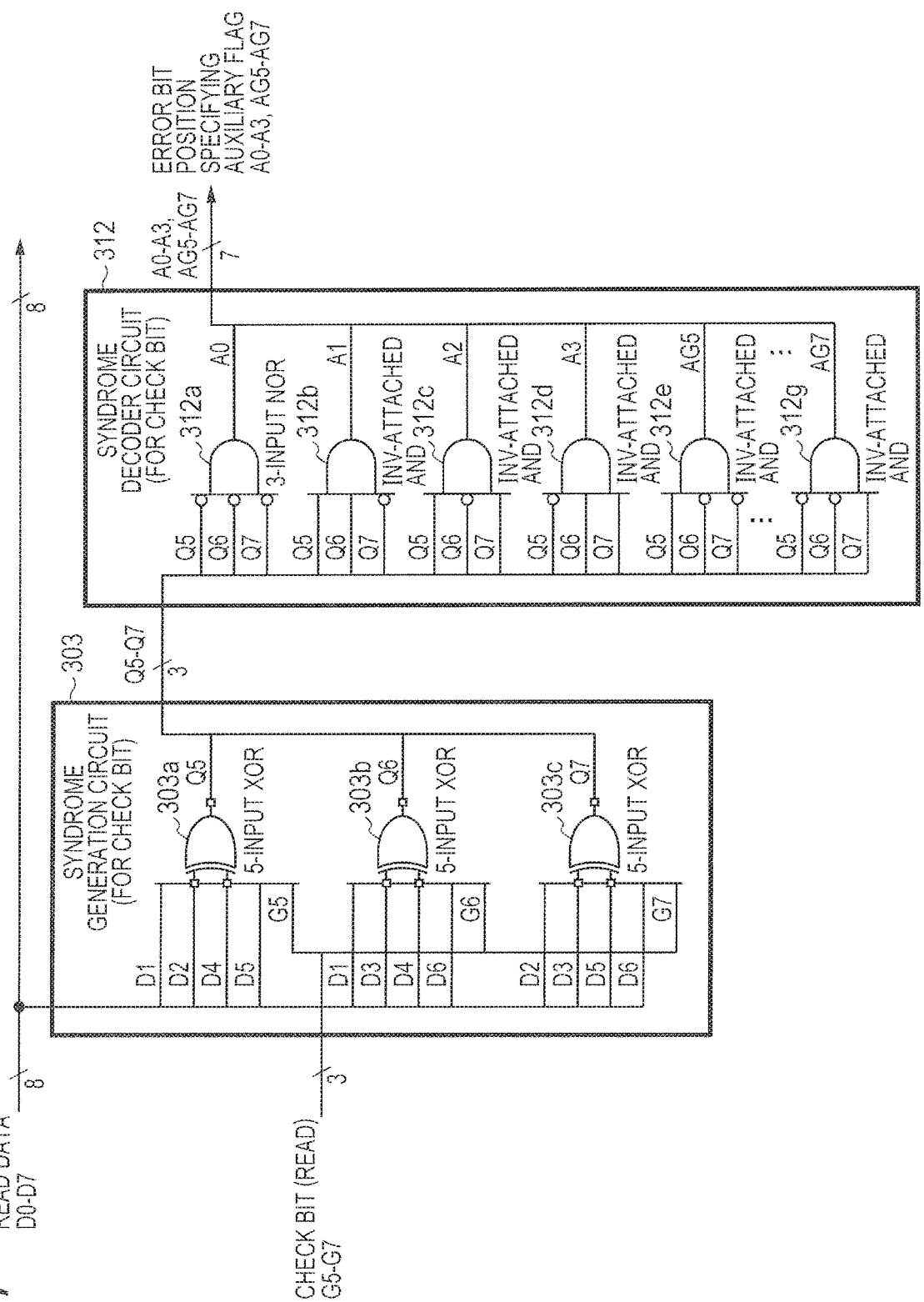
FIG. 37 is a block diagram illustrating an example of a concrete circuit configuration of a syndrome generation circuit 303 and a syndrome decoder circuit 312 of the decoder device 30D.

The check-bit check matrix illustrated in FIG. 36 is a matrix that generates the 3-bit syndrome code (Q5-Q7) from the 8-bit read data (D0-D7) and the 3-bit check bit (G5-G7). The check-bit check matrix illustrated in FIG. 36 includes the columns (drawn with oblique lines) corresponding to the ECC (E0-E4) of which the element is filled with 0 because it is not used for operations. FIG. 37 is a block diagram illustrating an example of a concrete circuit configuration of the syndrome generation circuit 303 and the syndrome decoder circuit 312 of the decoder device 30D.

As illustrated in FIG. 37, the syndrome generation circuit 303 is configured with three XOR circuits 303a-303c. The XOR circuits 303a-303c are 5-input XOR circuits. Each of the XOR circuits 303a-303c determines the value of one bit of the 3-bit syndrome codes (Q5-Q7) according to the check-bit check matrix illustrated in FIG. 36.

Q5 is obtained as an output of the XOR circuit 303a. Specifically, the XOR circuit 303a performs the XOR operations on D1, D2, D4, D5, and G5, and outputs the operation result as Q5. Similarly, Q6 is obtained as an output of the XOR circuit 303b. Q7 is obtained as an output of the XOR circuit 303c. The syndrome code (Q5-Q7) outputted from the syndrome generation circuit 303 is inputted into the syndrome decoder circuit 312.

The syndrome decoder circuit 312 is configured with a NOR circuit 312a and six INV-attached AND circuits 312b-312g, as illustrated in FIG. 37. The NOR circuit 312a is a 3-input NOR circuit. The INV-attached AND circuits 312b-312g are 3-input INV-attached AND circuits. The NOR circuit 312a and the INV-attached AND circuits 312b-312g output 1, respectively, when the 3-bit bit pattern (it corresponds to Q5-Q7 illustrated in FIG. 36) appearing in each column of the check-bit check matrix illustrated in FIG. 36 matches with the 3-bit bit pattern of the syndrome code (Q5-Q7).

As illustrated in FIG. 36, the 3-bit bit patterns appearing in each column of the check-bit check matrix are of seven kinds (000, 110, 101, 011, 100, 010, 001). Such operations of the syndrome decoder circuit 312 about the NOR circuit 312a and the INV-attached AND circuits 312b-312d for outputting the error bit position specifying auxiliary flag (A0-A3) are equivalent to checking the match between the 3-bit bit pattern appearing in each column of the check bit generation matrix illustrated in FIG. 33 and the bit pattern of the 3-bit syndrome code (Q5-Q7).

Each of the NOR circuit 312a and the INV-attached AND circuits 312b-312g outputs the error bit position specifying auxiliary flag (A0-A3, AG5-AG7). There are the following two kinds as the output pattern of the error bit position specifying auxiliary flag. The first output pattern is the output pattern that all A0-A3 and AG5-AG7 are 0. The second output pattern is the output pattern that any one of A0-A3 and AG5-AG7 is 1.

The syndrome decoder circuit 310 outputs the flag Cxx that is set to 1 only when all the bits of the syndrome code (S0-S4) are 0, separately from C0-C7. On the other hand, in the syndrome decoder circuit 312, the error bit position specifying auxiliary flag (A0) generated by the NOR circuit 312a is a flag that is set to 1 only when all the bits of the syndrome code (Q5-Q7) are 0. Accordingly, the syndrome decoder circuit 312 outputs only the error bit position specifying auxiliary flag (A0-A3, AG5-AG7). The syndrome decoder circuit 312 outputs the error bit position specifying auxiliary flag (A0-A3, AG5-AG7) to the error notification signal generating circuit 331.

The syndrome generation circuit 300 and the syndrome decoder circuit 310 of the decoder device 30D are also called the first syndrome unit. The first syndrome unit generates the first syndrome code (S0-S4) from the read data (D0-D7) and the ECC (E0-E4), read from the memory 6. The first syndrome unit generates the first flag (C0-C7, CE0-CE4) indicating whether this first syndrome code matches with the bit pattern of one column of the ECC check submatrix, and the second flag (Cxx) indicating whether all of the bits of the first syndrome code are 0.

The syndrome generation circuit 303 and the syndrome decoder circuit 312 of the decoder device 30D are also called the second syndrome unit. The second syndrome unit generates the second syndrome code (Q5-Q7) from the read data (D0-D7) and the check bit (G5-G7), read from the memory 6. The second syndrome unit generates the third flag (A0-A3, AG5-AG7) indicating whether the second syndrome code matches with the bit pattern of one column of the check-bit check matrix.

The error notification signal generating circuit 331 is also called the notification unit, compares the flag (C0-C7, CE0-CE4, Cxx) generated by the first syndrome unit with the flag (A0-A3, AG5-AG7) generated by the second syndrome unit, and generates an error notification signal based on the comparison result. That is, the error notification signal generating circuit 331 checks the matching between the flag generated by the first syndrome unit and the flag generated by the second syndrome unit, and generates the error bit position flag (C'0-C'7, CE' 0-CE' 4) and the error bit position specifying auxiliary flag (AG' 5-AG' 7) that have improved accuracy (reliability). In the similar manner, the error notification signal generating circuit 331 checks the matching between the no error flag (Cxx) and the error bit position specifying auxiliary flag (A0), and generates the no error flag (C'xx) that has improved accuracy (reliability).

As illustrated in FIG. 35, the error notification signal generating circuit 331 is configured with 17 AND circuits 331a-331q, an OR circuit 331r, and a NOR circuit 331s. The AND circuits 331a-331q are 2-input AND circuits.

The error bit position specifying auxiliary flag (A0) is set to 1, when the bit pattern of the syndrome code (Q5-Q7) matches with the bit pattern of the column corresponding to D0 or D7 in the check-bit check matrix illustrated in FIG. 36. The error bit position flag (C0) is set to 1, when the bit pattern of the syndrome code (S0-S4) matches with the bit pattern of the column corresponding to D0 in the ECC check submatrix illustrated in FIG. 36.

The error bit position flag (C7) is set to 1, when the bit pattern of the syndrome code (S0-S4) matches with the bit pattern of the column corresponding to D7 in the ECC check submatrix illustrated in FIG. 36. Therefore, the error notification signal generating circuit 331 compares C0 with A0, and compares C7 with A0. Accordingly, C0 and A0 are inputted into the AND circuit 331a, and the AND circuit 331a outputs C'0. C7 and A0 are inputted into the AND circuit 331h, and the AND circuit 331h outputs C'7.

The error notification signal generating circuit 331 performs similar comparison about other error bit position flags. That is, C1 and A1 are inputted into the AND circuit 331b, and the AND circuit 331b outputs C'1. C2 and A2 are inputted into the AND circuit 331c, and the AND circuit 331c outputs C'2. C3 and A3 are inputted into the AND circuit 331d, and the AND circuit 331d outputs C'3. C4 and A1 are inputted into the AND circuit 331e, and the AND circuit 331e outputs C'4. C5 and A2 are inputted into the AND circuit 331f, and the AND circuit 331f outputs C'5. C6 and A3 are inputted into the AND circuit 331g, and the AND circuit 331g outputs C'6.

The error bit position flag (CE0) is set to 1, when the bit pattern of the syndrome code (S0-S4) matches with the bit pattern of the column corresponding to E0 in the ECC check submatrix illustrated in FIG. 36. Here, as clarified from FIG. 36, when the bit pattern of the syndrome code (S0-S4) matches with the bit pattern of the column corresponding to E0, the bit pattern of the syndrome code (Q5-Q7) should be set to the pattern (0, 0, 0). With the use of A0, it is possible to determine whether the bit pattern of the syndrome code (Q5-Q7) is equal to the pattern (0, 0, 0). Therefore, the error notification signal generating circuit 331 compares CE0 with A0. That is, CE0 and A0 are inputted into the AND circuit 331i, and the AND circuit 331i outputs CE'0.

Similarly, CE1 and A0 are inputted into the AND circuit 331j, and the AND circuit 331j outputs CE'1. CE2 and A0 are inputted into the AND circuit 331k, and the AND circuit 331k outputs CE'2. CE3 and A0 are inputted into the AND circuit 331l, and the AND circuit 331l outputs CE'3. CE4 and A0 are inputted into the AND circuit 331m, and the AND circuit 331m outputs CE'4. AG5 and Cxx are inputted into the AND circuit 331n, and the AND circuit 331n outputs AG'5. AG6 and Cxx are inputted into the AND circuit 331o, and the AND circuit 331o outputs AG'6. AG7 and Cxx are inputted into the AND circuit 331p, and the AND circuit 331p outputs AG'7.

The AND circuits 331a-331p output 1, when both values of two kinds of inputted flags are 1, otherwise output 0. That is, when explained in terms of the first flag (C0-C7, CE0-CE4), the third flag (A0-A3, AG5-AG7), the first syndrome code (S0-S4), the second syndrome code (Q5-Q7), the ECC check submatrix, and the check-bit check matrix, the error notification signal generating circuit 331 generates a flag as follows. Only when both the first condition and the second condition are satisfied, the error notification signal generating circuit 331 generates the fifth flag (C'0 to C'7, CE'0-CE'4) indicating that the first syndrome code (S0-S4) matches with the bit pattern of the t-th column of the ECC check submatrix (t is a positive integer). Here, the first condition is that the first flag (C0-C7, CE0-CE4) indicates that the first syndrome code (S0-S4) matches with the bit pattern of the t-th column of the ECC generation submatrix. The second condition is that the third flag (A0-A3, AG5-AG7) indicates that the second syndrome code (Q5-Q4) matches with the bit pattern of the t-th column of the check-bit check matrix.

The error bit position specifying auxiliary flag (A0) is set to 1, when the bit pattern of the syndrome code (Q5-Q7) matches with the bit pattern of the column corresponding to D0 or D7, i.e., (0, 0, 0), in the check bit generation matrix illustrated in FIG. 33. Therefore, the no error flag (Cxx) outputted from the syndrome decoder circuit 310 and the error bit position specifying auxiliary flag (A0) outputted from the syndrome decoder circuit 312 are inputted into the AND circuit 331q. The AND circuit 331q outputs 1, when both the inputted values are 1, otherwise outputs 0. That is, when explained in terms of the second flag (Cxx), the third flag (A0-A3, AG5-AG7), the first syndrome code (S0-S4), and the second syndrome code (Q5-Q7), the error notification signal generating circuit 331 generates the flag (C'xx) as follows. The error notification signal generating circuit 331 generates the sixth flag (C'xx) indicating that all bits of the first syndrome code (S0-S4) are 0, only when the second flag (Cxx) indicates that all bits of the first syndrome code (S0-S4) are 0, and the predetermined third flag (A0) indicates that all bits of the second syndrome code (Q5-Q7) are 0.

The flags (C'0-C'7, CE'0-CE'4, AG'5-AG'7) are inputted into the OR circuit 331r, and the flag (C'xx) is inputted into the NOR circuit 331s. A circuit similar to the notification processing unit 320B is configured with the OR circuit 331r and the NOR circuit 331s. That is, the OR circuit 331r corresponds to the OR circuit 320i of FIG. 9, and the NOR circuit 331s corresponds to the NOR circuit 320j of FIG. 9. By adopting such a configuration, the error notification signal generating circuit 331 generates the error notification signal composed of the single-bit error notification signal and the double-bit error notification signal, based on the error bit position flag (C'0-C'7, CE'0-CE'4) and the no error flag (C'xx).

According to Embodiment 4, the decoder device 30D makes the error notification based on the comparison result of the output of the syndrome decoder circuit 310 and the output of the syndrome decoder circuit 312. That is, the decoder device 30D makes the error notification based on the value of the error bit position flag (C'0-C'7, CE'0-CE'4) and the value of the no error flag (C'xx) of which the accuracy is improved by the error notification signal generating circuit 331. This error notification is made by combining the error detection result by the ECC and the error detection result by the check bit. Therefore, also in Embodiment 4, it is possible to improve the detection performance of errors.

FIG. 38 is a table summarizing error detection misses occurring in the algorithm of the error detection according to Embodiment 4. FIG. 39 is a table summarizing the number of the cases of erroneous correction occurring in the algorithm of the error detection according to Embodiment 4. Interpretation of these tables is the same as that of FIG. 10 and FIG. 11. However, in Embodiment 4, the 8-bit write data (D0-D7), the 5-bit ECC (E0-E4), and the 3-bit check bit (G5-G7) are stored in the memory 6. Accordingly, FIG. 38 and FIG. 39 show the result from k=1 to k=16.

As seen from FIG. 10 and FIG. 38, the total number of the detection misses of errors does not change, however, in the comparative example, 55 detection misses of errors occur in k=4, but in Embodiment 4, 9 detection misses occur. In the comparative example, 96 detection misses of errors in total occur in k=5 and k=6; however, 76 detection misses occur in Embodiment 3. Thus, in Embodiment 4, it becomes possible to decrease the miss number when the value of k is comparatively small. In connection with this, as seen from FIG. 11 and FIG. 39, the number of the erroneous correction when the value of k is comparatively small also decreases.

The Modified Example of Embodiment

Finally, the Modified Example of Embodiment is explained. In the above-described embodiment, the rotation of the bit position of the input data inputted into the circuit that generates the ECC (check bit) is performed. However, other methods may be used. For example, the check bit may be generated using the data obtained by permutating some bit positions.

The combination of the column bit pattern of two kinds of ECC generation matrices applied to the encoder device may be different. That is, when a different bit pattern not included in the bit pattern appearing in each column of one of the two kinds of ECC generation matrices is usable as the ECC, the other of the two kinds of ECC generation matrices may be composed by permutating the bit pattern of one column of the one of the two kinds of ECC generation matrices with the different bit pattern concerned. It is also possible to use together the rotation of the bit positions and the permutation of some bit positions.

In Embodiment 1 to Embodiment 4, as a multi-bit error, the error that the value of some bits reverses (the value of the bits changes from 0 to 1 or from 1 to 0) is assumed, for example. However, a multi-bit error of other mode may be detected. For example, in the multi-bit error that occurs due to failure of a processing circuit of the data signal system or failure of an input/output terminal, it is assumed that all the data of multiple bits, or the data of a predetermined bit width depending on the configuration of the circuit are affected by a stuck-at fault (the value of a bit adheres to 0 or 1). Even in the case of such assumption, it is possible to improve the detection performance of the multi-bit error similarly.

By the way, when the ECC generation matrix illustrated in FIG. 3 and the ECC check matrix illustrated in FIG. 7 are used for example, if all the bits of data are 0, all the bits of ECC are also set to 0. Accordingly, the multi-bit error in which all the bits of the data and ECC are affected by the stuck-at fault (adhering to 0) will be missed theoretically. However, if an inverted value for one bit of the ECC is stored in the memory, it becomes possible to detect the error without missing. Therefore, when a stuck-at fault (adhering to 0 or 1) is assumed, it is possible to reduce the probability (percentage) of missing the multi-bit error, by using the ECC (and the check bit) with a reversed value of a specific bit. That is, it is possible to reduce the probability (percentage)

of missing the multi-bit error, by reversing the value of one specific bit of the ECC generated from data according to the ECC generation matrix and storing it in the memory, and by generating the syndrome according to the ECC check matrix after reversing the value of the specific bit of the ECC read from the memory. This is for the following reason. The value of each bit of the read data and the value of each bit of the ECC (and the check bit) used as the input to the syndrome generation circuit in the ECC decoder circuit are not independent; accordingly, the total number of the combination of the multi-bit errors due to a stuck-at fault (adhering to 0 or 1) becomes fewer, and the number of the cases of the missing and erroneous correction of the multi-bit error also becomes fewer.

In Embodiment 1-Embodiment 4, it is possible to improve the detection performance of the multi-bit error that occurs due to failure of the processing circuit or the input/output terminal of the data signal system in the interface circuit for read/write to the memory (and failure of the data input/output circuit inside the memory), for example. However, the above-described configuration for the error detection may be used in other modes. For example, the error detection may be performed by use of a configuration combining the configuration to perform processing by the ECC (and the check bit) that is appended for the read/write of data to the memory and the configuration to perform processing by the EDC (Error Detecting Code) that is appended for the data transfer in the internal bus of a SOC.

By the way, when an ECC is appended for the read/write of data to the memory, the dual-redundant hardware configuration is adopted in some cases, in order to prevent the function of the single error correction and double error detection from stopping normal operations due to the failure in the ECC decoder circuit. In this configuration, an additional ECC decoder circuit (for checking) is provided, and a comparator circuit checks whether the output signal of the original ECC decoder circuit matches with the output signal of the additional ECC decoder circuit (for checking). Similarly, in the ECC encoder circuit, the dual-redundant hardware configuration is adopted in some cases. In the above-described embodiments, by adopting the configuration in which an ECC decoder circuit (for check bits) and an ECC encoder circuit (for check bits) are provided additionally, the effect equivalent to the dual-redundant hardware will be acquired against failure of the ECC decoder circuit or the ECC encoder circuit, although the configuration is different from the dual-redundant hardware configuration.

The above explanation is made for the configuration in which the encoder device and the decoder device are implemented by hardware circuitry. However, some or all of the encoder device or some or all of the decoder device may be realized software-wise by the program including instructions run by a processor.

The above-described program can be stored using various types of non-transitory computer readable media, and can be supplied to the computer. The non-transitory computer readable media include various types of tangible storage media. The example of the non-transitory computer readable medium includes a magnetic recording medium (for example, a flexible disk, a magnetic tape, and a hard disk drive), an optical magnetic recording medium (for example, a magneto-optical disk), CD-ROM (Read Only Memory), CD-R, CD-R/W, a semiconductor memory (for example, a mask ROM, a PROM (a programmable ROM), an EPROM (an erasable PROM), a flash ROM, a RAM (Random Access Memory)). The program may be supplied to the computer by various types of transitory computer readable media. The example of the transitory computer readable media includes an electrical signal, a light signal, and electromagnetic waves. The transitory computer readable media can supply a program to a computer via a wired communication path, such as an electric wire and an optical fiber, or a wireless communication path.

As described above, the invention accomplished by the present inventors has been concretely explained based on the embodiments. However, it cannot be overemphasized that the present invention is not restricted to the embodiments as described above, and it can be changed variously in the range which does not deviate from the gist. For example, the number of bits of the input data, the ECC, and the check bit, is an example, and the number of bits may be other than the number of bits referred to in the above-described embodiments.

Some or all of the embodiments may be described also as the following additional remarks; however, they are not restricted to the following.

(Additional remark 1)

A data processing device includes:

an encoder device; and a decoder device, the encoder device includes a first encoder unit to generate an ECC (Error Correction Code) capable of single error correction and double error detection by performing operations according to a first ECC generation matrix; and a second encoder unit to generate an ECC capable of the single error correction and double error detection by performing operations according to a second ECC generation matrix obtained by permutating a column of the first ECC generation matrix, the first encoder unit receives first data to generate a first ECC for the first data, the second encoder unit receives second data obtained by permutating a bit of the first data, to generate a second ECC for the second data, the encoder device stores the first data, the first ECC, and the second ECC in a memory, and the decoder device generates a notification signal indicative of the occurrence state of errors of the first data, based on the first data, the first ECC, and the second ECC, read from the memory.

(Additional remark 2)

In the data processing device according to Additional remark 1, the decoder device includes a first decoder unit to receive a first bit string comprised of the first data and the first ECC, read from the memory, and to generate a first determination signal indicative of whether a correctable single-bit error exists in the first bit string and a second determination signal indicative of whether a two or more-bit error exists in the first bit string;

a second decoder unit to receive a second bit string comprised of third data obtained by permutating a bit of the first data read from the memory as in the second data and the second ECC read from the memory, and to generate a third determination signal indicative of whether a correctable single-bit error exists in the second bit string and a fourth determination signal indicative of whether a two or more-bit error exists in the second bit string; and a notification unit to generate the notification signal, based on the first determination signal, the second determination signal, the third determination signal, and the fourth determination signal.

(Additional remark 3)

In the data processing device according to Additional remark 2, when only one of the first determination signal and the third determination signal indicates the existence of a correctable single-bit error, the notification unit generates the notification signal indicating that the bit string comprised of the first data, the first ECC, and the second ECC, read from the memory includes a two or more-bit error.

(Additional remark 4)

In the data processing device according to Additional remark 2, when at least one of the second determination signal and the fourth determination signal indicates the existence of a two or more-bit error, the notification unit generates the notification signal indicating that the bit string comprised of the first data, the first ECC, and the second ECC, read from the memory, includes a two or more-bit error.

(Additional remark 5)

In the data processing device according to Additional remark 1, the decoder device includes a first syndrome unit to generate a first syndrome code from the first data and the first ECC, read from the memory, and to generate a first flag indicative of whether the first syndrome code matches with the bit pattern of any column of a first ECC check matrix comprised of the first ECC generation matrix and a unit matrix and a second flag indicative of whether all bits of the first syndrome code are 0;

a second syndrome unit to generate a second syndrome code from third data obtained by permutating a bit of the first data read from the memory as in the second data and the second ECC read from the memory, and to generate a third flag indicative of whether the second syndrome code matches with the bit pattern of any column of a second ECC check matrix comprised of the second ECC generation matrix and a unit matrix and a fourth flag indicative of whether all bits of the second syndrome code are 0; and a syndrome check unit to compare the first flag and the third flag and to compare the second flag and the fourth flag, and the decoder device generates the notification signal based on the comparison result of the syndrome check unit.

(Additional remark 6)

In the data processing device according to Additional remark 5, only when the first flag indicates that the first syndrome code matches with the bit pattern of the t-th column of the first ECC check matrix (t is a positive integer indicative of a column number corresponding to any column of the first ECC generation matrix included in the first ECC check matrix) and when the third flag indicates that the second syndrome code matches with the bit pattern of the t-th column of the second ECC check matrix, the syndrome check unit outputs, as a fifth flag, a flag indicating that the first syndrome code matches with the bit pattern of the t-th column of the first ECC check matrix, and when the first flag indicates that the first syndrome code matches with the bit pattern of the s-th column of the first ECC check matrix (s is a positive integer indicative of a column number corresponding to any column of the unit matrix included in the first ECC check matrix), or when the third flag indicates that the second syndrome code matches with the bit pattern of the s-th column of the second ECC check matrix, the syndrome check unit outputs, as the fifth flag, a flag indicating that the first syndrome code matches with the bit pattern of the s-th column of the first ECC check matrix.

(Additional remark 7)

In the data processing device according to Additional remark 6, the decoder device further includes an error correction unit to correct the single-bit error of the first data read from the memory based on the fifth flag.

(Additional remark 8)

In the data processing device according to Additional remark 6, only when the second flag indicates that all bits of the first syndrome code are 0 and when the fourth flag indicates that all bits of the second syndrome code are 0, the syndrome check unit outputs a sixth flag indicating that all bits of the first syndrome code are 0, and the decoder device further includes a notification unit to generate the notification signal based on the value of the fifth flag and the value of the sixth flag.

(Additional remark 9)

In the data processing device according to Additional remark 1, the second ECC generation matrix is obtained by rotating each column of the first ECC generation matrix, and the second data is obtained by rotating each bit of the first data.

(Additional remark 10)

In the data processing device according to Additional remark 1, the second ECC generation matrix is obtained by permutating multiple columns having the same value of a predetermined row in the first ECC generation matrix, the encoder device stores in the memory the first data, all bits of the first ECC generated by the first encoder unit, and a part of the bits of the second ECC generated by the second encoder unit, the part of the bits is obtained by the operations using rows other than the predetermined row in the second ECC generation matrix, and the decoder device generates the notification signal based on the first data, the first ECC, and the part of the bits of the second ECC, read from the memory.

(Additional remark 11)

A data processing device includes:

an encoder device; and a decoder device, the encoder device includes a check bit generation unit to generate q check bits, by performing operations according to a q-row submatrix of a first ECC generation matrix for generating a p-bit ECC (Error Correction Code) capable of the single error correction and double error detection (p and q are positive integers and q is less than p); and an ECC generation unit to generate an r-bit ECC capable of the single error correction and double error detection, by performing operations according to an r-row second ECC generation matrix (r=p-q) as a submatrix of the first ECC generation matrix with the q-row submatrix removed, the ECC generation unit receives first data to generate the ECC for the first data, the check bit generation unit receives the first data to generate the check bit for the first data, the encoder device stores the first data, the ECC, and the check bit in a memory, the decoder device includes
a first syndrome unit to generate a first syndrome code from the first data and the ECC, read from the memory, and to generate a first flag indicative of whether the first syndrome code matches with a bit pattern of any column of the r-row submatrix in an ECC check matrix comprised of the first ECC generation matrix and a unit matrix and a second flag indicative of whether all bits of the first syndrome code are 0;

a second syndrome unit to generate a second syndrome code from the first data and the check bit, read from the memory, and to generate a third flag indicative of whether the second syndrome code matches with a bit pattern of any column of the q-row submatrix in an ECC check matrix comprised of the first ECC generation matrix and a unit matrix; and a notification unit to compare the flag generated by the first syndrome unit with the flag generated by the second syndrome unit and to generate a notification signal indicative of the occurrence state of errors of the first data based on the comparison result.

(Additional remark 12)

A data processing method includes the steps of:

generating a first ECC (Error Correction Code) capable of the single error correction and double error detection for first data by performing operations according to a first ECC generation matrix;

generating a second ECC capable of the single error correction and double error detection for second data obtained by permutating a bit of the first data, by performing operations according to a second ECC generation matrix obtained by permutating a column of the first ECC generation matrix;

storing the first data, the first ECC, and the second ECC in a memory; and generating a notification signal indicative of the occurrence state of errors of the first data, based on the first data, the first ECC, and the second ECC, read from the memory.

(Additional remark 13)

A data processing method includes the steps of:

generating a q-bit check bit for first data, by performing operations according to a q-row submatrix of a first ECC generation matrix for generating a p-bit ECC (Error Correction Code) capable of the single error correction and double error detection (p and q are positive integers and q is less than p);

generating an r-bit ECC capable of the single error correction and double error detection, by performing operations according to an r-row second ECC generation matrix (r=p−q) as a submatrix of the first ECC generation matrix with the q-row submatrix removed;

storing the first data, the ECC, and the check bit in a memory;

generating a first syndrome code from the first data and the ECC, read from the memory, and generating a first flag indicative of whether the first syndrome code matches with a bit pattern of any column of the r-row submatrix of an ECC check matrix comprised of the first ECC generation matrix and a unit matrix and a second flag indicative of whether all bits of the first syndrome code are 0;

generating a second syndrome code from the first data and the check bit, read from the memory, and generating a third flag indicative of whether the second syndrome code matches with a bit pattern of any column of the q-row submatrix in an ECC check matrix comprised of the first ECC generation matrix and a unit matrix;

comparing the flag generated based on the first syndrome code with the flag generated based on the second syndrome code; and generating a notification signal indicative of the occurrence state of errors of the first data, based on the comparison result.

What is claimed is:

1. A data processing device comprising:
an encoder device; and
a decoder device,
wherein the encoder device comprises:
a first encoder unit to generate an ECC (Error Correction Code) capable of single error correction and double error detection by performing operations according to a first ECC generation matrix; and
a second encoder unit to generate an ECC capable of the single error correction and double error detection by performing operations according to a second ECC generation matrix obtained by permutating a column of the first ECC generation matrix,
wherein the first encoder unit receives first data to generate a first ECC for the first data,
wherein the second encoder unit receives second data obtained by permutating a bit of the first data to generate a second ECC for the second data,
wherein the encoder device stores the first data, the first ECC, and the second ECC in a memory, and
wherein the decoder device determines a presence of errors in the first data based on 1) the first data and the first ECC read from the memory and 2) data obtained by permutating the first data read from the memory and the second ECC read from the memory, and generates a notification signal indicative of an occurrence state of errors of the first data, based on a result of the determination.

2. The data processing device according to claim 1, wherein the decoder device comprises:
a first decoder unit to receive a first bit string comprised of the first data and the first ECC read from the memory, and to generate a first determination signal indicative of whether a correctable single-bit error exists in the first bit string and a second determination signal indicative of whether a two or more-bit error exists in the first bit string;
a second decoder unit to receive a second bit string comprised of third data obtained by permutating a bit of the first data read from the memory as in the second data and the second ECC read from the memory, and to generate a third determination signal indicative of whether a correctable single-bit error exists in the second bit string and a fourth determination signal indicative of whether a two or more-bit error exists in the second bit string; and
a notification unit to generate the notification signal, based on the first determination signal, the second determination signal, the third determination signal, and the fourth determination signal.

3. The data processing device according to claim 2, wherein, when only one of the first determination signal and the third determination signal indicates the existence of a correctable single-bit error, the notification unit generates the notification signal indicating that the bit string comprised of the first data, the first ECC, and the second ECC, read from the memory includes a two or more-bit error.

4. The data processing device according to claim 2, wherein, when at least one of the second determination signal and the fourth determination signal indicates the existence of a two or more-bit error, the notification unit generates the notification signal indicating that the bit string comprised of the first data, the first ECC, and the second ECC, read from the memory includes a two or more-bit error.

5. The data processing device according to claim 1, wherein the decoder device comprises:
- a first syndrome unit to generate a first syndrome code from the first data and first ECC, read from the memory, and to generate a first flag indicative of whether the first syndrome code matches with a bit pattern of any column of a first ECC check matrix comprised of the first ECC generation matrix and a unit matrix and a second flag indicative of whether all bits of the first syndrome code are 0;
- a second syndrome unit to generate a second syndrome code from third data obtained by permutating a bit of the first data read from the memory as in the second data and the second ECC read from the memory, and to generate a third flag indicative of whether the second syndrome code matches with a bit pattern of any column of a second ECC check matrix comprised of the second ECC generation matrix and a unit matrix and a fourth flag indicative of whether all bits of the second syndrome code are 0; and
- a syndrome check unit to compare the first flag with the third flag and to compare the second flag with the fourth flag, and
- wherein the decoder device generates the notification signal based on a comparison result of the syndrome check unit.

6. The data processing device according to claim 5, wherein, only when the first flag indicates that the first syndrome code matches with a bit pattern of a t-th column of the first ECC check matrix (t is a positive integer indicative of a column number corresponding to any column of the first ECC generation matrix included in the first ECC check matrix) and when the third flag indicates that the second syndrome code matches with a bit pattern of the t-th column of the second ECC check matrix, the syndrome check unit outputs, as a fifth flag, a flag indicating that the first syndrome code matches with the bit pattern of the t-th column of the first ECC check matrix, and
wherein, when the first flag indicates that the first syndrome code matches with a bit pattern of a s-th column of the first ECC check matrix (s is a positive integer indicative of a column number corresponding to any column of the unit matrix included in the first ECC check matrix), or when the third flag indicates that the second syndrome code matches with a bit pattern of the s-th column of the second ECC check matrix, the syndrome check unit outputs, as the fifth flag, a flag indicating that the first syndrome code matches with the bit pattern of the s-th column of the first ECC check matrix.

7. The data processing device according to claim 6, wherein the decoder device further comprises:
- an error correction unit to correct the single-bit error of the first data read from the memory based on the fifth flag.

8. The data processing device according to claim 6, wherein, only when the second flag indicates that all bits of the first syndrome code are 0 and when the fourth flag indicates that all bits of the second syndrome code are 0, the syndrome check unit outputs a sixth flag indicating that all bits of the first syndrome code are 0, and
wherein the decoder device further comprises:
- a notification unit to generate the notification signal based on the value of the fifth flag and the value of the sixth flag.

9. The data processing device according to claim 1, wherein the second ECC generation matrix is obtained by rotating each column of the first ECC generation matrix, and
wherein the second data is obtained by rotating each bit of the first data.

10. The data processing device according to claim 1, wherein the second ECC generation matrix is obtained by permutating multiple columns having the same value of a predetermined row in the first ECC generation matrix,
wherein the encoder device stores in the memory the first data, all bits of the first ECC generated by the first encoder unit, and a part of the bits of the second ECC generated by the second encoder unit,
wherein the part of the bits is obtained by the operations using rows other than the predetermined row in the second ECC generation matrix, and
wherein the decoder device generates the notification signal based on the first data, the first ECC, and the part of the bits of the second ECC, read from the memory.

11. A data processing device comprising:
an encoder device; and
a decoder device,
wherein the encoder device comprises:
- a check bit generation unit to generate q check bits, by performing operations according to a q-row submatrix of a first ECC generation matrix for generating a p-bit ECC (Error Correction Code) capable of single error correction and double error detection (p and q are positive integers and q is less than p); and
- an ECC generation unit to generate an r-bit ECC capable of the single error correction and double error detection, by performing operations according to an r-row second ECC generation matrix (r=p-q) as a submatrix of the first ECC generation matrix with the q-row submatrix removed,
wherein the ECC generation unit receives first data to generate the ECC for the first data,
wherein the check bit generation unit receives the first data to generate the check bit for the first data,
wherein the encoder device stores the first data, the ECC, and the check bit in a memory,
wherein the decoder device comprises:
- a first syndrome unit to generate a first syndrome code from the first data and the ECC, read from the memory, and to generate a first flag indicative of whether the first syndrome code matches with a bit pattern of any column of the r-row submatrix in an ECC check matrix comprised of the first ECC generation matrix and a unit matrix and a second flag indicative of whether all bits of the first syndrome code are 0;
- a second syndrome unit to generate a second syndrome code from the first data and the check bit, read from the memory, and to generate a third flag indicative of whether the second syndrome code matches with a bit pattern of any column of the q-row submatrix in an ECC check matrix comprised of the first ECC generation matrix and a unit matrix; and a notification unit to compare the flag generated by the first syndrome unit with the flag generated by the second syndrome unit and to generate a notification signal indicative of an occurrence state of errors of the first data based on a comparison result.

12. A data processing method comprising the steps of:

generating a first ECC (Error Correction Code) capable of the single error correction and double error detection for first data by performing operations according to a first ECC generation matrix;

generating a second ECC capable of the single error correction and double error detection for second data obtained by permutating a bit of the first data by performing operations according to a second ECC generation matrix obtained by permutating a column of the first ECC generation matrix;

storing the first data, the first ECC, and the second ECC in a memory;

determining a presence of errors in the first data based on 1) the first data and the first ECC read from the memory and 2) data obtained by permutating the first data read from the memory and the second ECC read from the memory; and generating a notification signal indicative of an occurrence state of errors of the first data, based on a result of the determination.

* * * * *